(12) United States Patent
Suzuki

(10) Patent No.: US 7,636,149 B2
(45) Date of Patent: Dec. 22, 2009

(54) OPTICAL SYSTEMS THAT CORRECT OPTICAL IRREGULARITIES, AND PROJECTION-EXPOSURE SYSTEMS AND METHODS COMPRISING SAME

(75) Inventor: Kenji Suzuki, Kosigaya (JP)

(73) Assignee: Nikon Corporation, Tokyo (JP)

( * ) Notice: Subject to any disclaimer, the term of this patent is extended or adjusted under 35 U.S.C. 154(b) by 511 days.

(21) Appl. No.: 10/556,712

(22) PCT Filed: May 6, 2004

(86) PCT No.: PCT/JP2004/006416

§ 371 (c)(1),
(2), (4) Date: Nov. 9, 2005

(87) PCT Pub. No.: WO2004/100236

PCT Pub. Date: Nov. 18, 2004

(65) Prior Publication Data

US 2007/0041004 A1    Feb. 22, 2007

(30) Foreign Application Priority Data

May 9, 2003    (JP)    ............................... 2003-131440

(51) Int. Cl.
*G03B 27/54*    (2006.01)
*G03B 27/42*    (2006.01)

(52) U.S. Cl. .......................................... 355/67; 355/53

(58) Field of Classification Search .................... 355/52, 355/53, 55, 67–71
See application file for complete search history.

(56) References Cited

U.S. PATENT DOCUMENTS

| 5,594,526 A * | 1/1997 | Mori et al. ..................... 355/67 |
| 6,195,201 B1 * | 2/2001 | Koch et al. ................... 359/366 |
| 6,885,432 B2 * | 4/2005 | Tsuji ........................... 355/67 |
| 2003/0031017 A1 | 2/2003 | Tsuji |

FOREIGN PATENT DOCUMENTS

| JP | 2000-162414 | 6/2000 |
| JP | 2000-162415 | 6/2000 |
| JP | 2001-244168 | 9/2001 |
| WO | WO00/57459 | 9/2000 |

\* cited by examiner

*Primary Examiner*—Hung Henry Nguyen
(74) *Attorney, Agent, or Firm*—Klarquist Sparkman, LLP

(57) ABSTRACT

An object of this invention is to reduce even slight irregularities in illumination that occur after assembly of an optical system. To this end, in an exemplary illumination-optical system, a light source that emits extreme ultraviolet (EUV) light, a collimator, a fly's-eye mirror, and a condenser are positioned, in this stated order. A prescribed illumination area on the emission side of the condenser is irradiated with Köhler illumination. At least one unit mirror, among multiple unit mirrors of the fly's-eye mirror, is a correction mirror that has reflectivity irregularities. The reflectivity irregularities correct a portion of, or all, the illumination irregularities in the illumination area.

18 Claims, 33 Drawing Sheets

(a)

(b)

(c)

(a)

(b)

(a)

(b)

(a)

(b)

(a)

(b)

(a) Transmissivity Distribution of Filter Portion fs

Corresponding to Exposure Area (b) Transmissivity Distribution of Filter Portion fp Corresponding to Exposure Area (c) Transmissivity Distribution of Filter Portion fd Corresponding to Exposure Area (a)

(b)

Transmissivity Characteristic of Correction Filter F

Corresponding to Exposure Area (a)

(b)

OPTICAL SYSTEMS THAT CORRECT OPTICAL IRREGULARITIES, AND PROJECTION-EXPOSURE SYSTEMS AND METHODS COMPRISING SAME

CROSS REFERENCE TO RELATED APPLICATION

This is a corresponding national-phase application of, and claims priority from, PCT/JP2004/006416, filed on May 6, 2004, and published as WO 2004/100236 A1 on Nov. 18, 2004, which is incorporated herein by reference in its entirety.

FIELD

This invention relates to illumination-optical systems mounted in a projection-exposure system or similar system. This invention further relates to projection-exposure systems, methods for manufacturing microdevices, methods for manufacturing illumination systems, methods for adjusting projection-exposure systems, and methods for manufacturing projection-exposure systems.

BACKGROUND

Projection-exposure systems are moving toward use of exposure light having increasingly shorter wavelengths, in order to boost integration densities in semiconductor devices.

The light sources employed in such systems include the i-line of mercury (wavelength 365.015 nm), KrF excimer lasers (wavelength 248 nm), ArF excimer lasers (wavelength 193 nm), and $F_2$ excimer lasers (wavelength 157 nm). In addition, the use of extreme ultraviolet (hereafter "EUV") light, and in particular EUV light at wavelengths of 50 nm and less, as the light source is also being studied.

It should be noted that, when using EUV light at a wavelength of 50 nm or less, the need arises to employ reflective elements in at least a portion of the optical system (as for example in the illumination-optical system described in Japan Laid-Open Patent Document No. 2000-349009).

In the past, research has been conducted on the uniformity of illumination in the field of optical design of illumination-optical systems. Similar performance is also being required of illumination-optical systems for use with EUV light. Further, illumination-optical systems intended for use with EUV light are required to meet stricter specification requirements than are other illumination-optical systems, and it is expected that, subsequent to the optical design, measures will need to be taken to alleviate even slight irregularities in illumination at the time of actual optical-system assembly. Here "illumination irregularities" refers to, for example, uneven illumination distribution and uneven light-intensity distribution occurring at the illuminated surface (reticle surface, surface of a wafer for exposure, or similar). As a result, exposure irregularities occur in, for example, an exposure system.

SUMMARY

An object of this invention is the provision of illumination-optical systems in which even slight illumination irregularities are reduced after assembly of the optical system.

Another object is the provision of high-performance projection-exposure systems that exhibit minimal exposure irregularities.

A further object is the provision of microdevice-manufacturing methods by which high-performance microdevices can be produced.

A further object is the provision of methods for manufacturing an illumination system, the methods achieving production of high-performance illumination systems that exhibit reduced illumination irregularities.

A further object is the provision of methods for adjusting projection-exposure systems, the methods achieving reduction of exposure irregularities of the projection-exposure systems.

A further object is the provision of methods for manufacturing high-performance projection-exposure systems that exhibit minimal exposure irregularities.

An embodiment of an illumination-optical system of this invention comprises, in this order, a light source that emits extreme ultraviolet (EUV) light, a collimator, a fly's-eye mirror, and a condenser. A prescribed illumination area on the emission side of the condenser is irradiated with Köhler illumination. The fly's-eye mirror comprises multiple unit mirrors. At least one of the unit mirrors of the fly's-eye mirror is a correction mirror that has one or more "reflectivity irregularities" that correct a portion of, or all of, corresponding "illumination irregularities" in the illumination area. A ratio of the number of correcting mirrors to the number of unit mirrors in the fly's-eye mirror desirably is established according to the extent of the illumination irregularities being exhibited by the illumination-optical system.

In one embodiment, each unit mirror and correction mirror comprises a respective multilayer film that facilitates the respective reflectivity of the unit mirror. The multilayer film of each correction mirror desirably has a respective number of layers established according to a respective distribution in order to achieve the above-described reflectivity irregularities.

The multiple unit mirrors and the correction mirrors can be oriented in the fly's-eye mirror such that their respective angles of incidence to incident light are respective angles of total reflection. The reflecting surfaces of the correction mirrors can have respective surface structures that are distributed so as to realize the above-described reflectivity irregularities. In this embodiment the EUV light emitted from the light source desirably has a wavelength of 50 nm or less. In such an instance, the unit mirrors are made of ruthenium (Ru) or molybdenum (Mo) and are positioned and oriented such that the angle of incidence is 15° or less.

Another embodiment of an illumination-optical system according to the invention comprises, in order of position, a light source that emits EUV light, a collimator, a fly's-eye mirror, and a condenser. A prescribed illumination area on the emission side of the condenser is irradiated with Köhler illumination. The fly's-eye mirror comprises multiple unit mirrors. On the incidence side of at least one of the unit mirrors of the fly's-eye mirror is a correction filter exhibiting respective transmission irregularities. The correction filter corrects, in whole or in part, corresponding illumination irregularities in the illumination area. A ratio of the number of correction filters to the number of the unit mirrors desirably is established according to the extent of the illumination irregularities. The correction filter desirably has a distribution of thickness that produces the respective transmission irregularities. In this embodiment the plural unit mirrors desirably are positioned and oriented such that the angle of incidence of incident light is an angle of total reflection. The EUV light emitted from the light source desirably has a wavelength of 50 nm or less, in which instance the unit mirrors desirably comprise Ru or Mo and are positioned and oriented such that the angle of incidence is 15° or less.

The correction mirrors can be configured to correct illumination irregularities arising from polarized light that is polarized in at least one direction of the two intersecting polarization directions of the light illuminating the illumination area. The correction mirrors desirably have a first reflectivity distribution characteristic for a first polarization component, so as to correct illumination irregularities of the first polarization component illuminating the illumination area. The correction mirrors also desirably have a second reflectivity distribution characteristic for a second polarization component, so as to correct illumination irregularities of the second polarization component, polarized in a direction intersecting the first polarization component, in the illumination area. Similarly, the correction filters desirably have a first transmissivity distribution characteristic for a first polarization component, so as to correct illumination irregularities of the first polarization component illuminating the illumination area. The correction filters also desirably have a second transmissivity distribution characteristic for a second polarization component, so as to correct illumination irregularities of the second polarization component, polarized in a direction intersecting the first polarization component, in the illumination area.

The correction filter can comprise a first filter member, having a first transmissivity distribution with respect to a first polarization component, to correct illumination irregularities due to the first polarization component illuminating the illumination area. This correction filter desirably also comprises a second filter member, having a second transmissivity distribution with respect to a second polarization component, polarized in a direction intersecting the first polarization component, to correct illumination irregularities due to the second polarization component in the illumination area.

Another embodiment of an illumination-optical system according to the invention comprises multiple optical members to guide a prescribed light for illumination of a prescribed illumination area. The system includes a correction means for correcting illumination irregularities occurring in the illumination area due to a non-uniform distribution of intensity of polarized light in the illumination light. The correction means can be configured to correct illumination irregularities occurring due to polarized light polarized in at least one direction, among polarized light polarized in two intersecting directions, that illuminates the illumination area. The correction means desirably has optical characteristics including characteristics for correcting the illumination irregularities of a first polarization component of light illuminating the illumination area and characteristics for correcting a second polarization component (polarized in a direction intersecting the first polarization component) of light illuminating the illumination area. Further desirably, the optical characteristics of the correction means include characteristics that correct the illumination irregularities and that correct differences in intensity between the first polarization component and the second polarization component.

The correction means can comprise a first correction member having respective optical characteristics that correct illumination irregularities in the first polarization component of light illuminating the illumination area, and a second correction member having respective optical characteristics that correct illumination irregularities in the second polarization component of light. The correction means can be placed at a position that is optically conjugate with the illumination area, or alternatively at a position shifted a prescribed amount from the optically conjugate position.

At least one among the multiple optical members desirably is a fly's-eye mirror comprising multiple unit mirrors. In this instance, the correction means can be provided on at least one of the unit mirrors.

Another embodiment of an illumination-optical system according to the invention comprises multiple reflecting members that guide EUV light (of wavelength 50 nm or less) to illuminate a prescribed illumination area. The system also includes correction means, placed at a position that is optically conjugate with the illumination area or at a position shifted a prescribed amount from the optically conjugate position, having optical characteristics suitable for correcting illumination irregularities in the illumination area. Each of the multiple reflecting members has a reflecting face including a respective multilayer film to improve reflectivity of the reflecting face.

Another embodiment of an illumination-optical system according to the invention comprises multiple reflecting members that guide EUV (of wavelength 50 nm or less) to illuminate a prescribed illumination area. The system also includes correction means, placed at a position that is optically conjugate with the illumination area or at a position shifted a prescribed amount from the optically conjugate position, having optical characteristics suitable for correcting illumination irregularities in the illumination area. At least one of the multiple reflecting members is placed and oriented at an angle of incidence to incident light that is an angle of total reflection. At least one of the multiple reflecting members desirably is a fly's-eye mirror comprising multiple unit mirrors.

Another embodiment of an illumination-optical system according to the invention comprises multiple reflecting members that guide prescribed light for illumination of a prescribed illumination area. The system includes correction means having optical characteristics suitable for correcting illumination irregularities in the illumination area. The optical characteristics of the correction means are established, taking into consideration information on the reflectivity distribution of at least one among the multiple reflecting members. The optical characteristics of the correction means desirably are established by also taking into consideration information on actual measurements of the illumination irregularities.

Desirably, at least one of the multiple reflecting members is a fly's-eye mirror comprising multiple unit mirrors. Further desirably, the optical characteristics of the correction means are established taking into consideration information on the reflectivity characteristics of at least one of the multiple unit mirrors. Further desirably, the correction means is provided on at least one of the multiple unit mirrors. A multilayer film for improved reflectivity can be formed on each of the reflecting faces of the multiple reflecting members. At least one among the multiple reflecting members can be placed in an orientation such that the angle of incidence of incident light thereon is an angle of total reflection.

The correction means desirably corrects illumination irregularities due to a non-uniform light-intensity distribution of polarized light in the illumination area. The optical characteristics of the correction means can be established to correct light-intensity irregularities of a first polarization component illuminating the illumination area and to correct light-intensity irregularities of a second polarization component (polarized in a direction intersecting the first polarization component) illuminating the illumination area. The optical characteristics of the correction means can be established to correct illumination irregularities and intensity differences between the first polarization component and the second polarization component.

The correction means can comprise first correction means having respective optical characteristics sufficient for correcting illumination irregularities of the first polarization component of light illuminating the illumination area, and second correction means having respective optical characteristics sufficient for correcting illumination irregularities of the second polarization component of the light illuminating the illumination area.

An embodiment of a projection-exposure system according to the invention comprises a mask stage that holds a mask (also termed herein a "reticle") at a first surface, a substrate stage that holds a photosensitive substrate at a second surface, and a projection-optical system that projects an image of the first surface onto the second surface. The projection-exposure system includes any of the illumination-optical systems according to the invention for simultaneously illuminating the first and the second surfaces by illuminating the first surface. The illumination-optical system is configured in advance to correct illumination irregularities in the first surface or in the second surface as the illumination area.

An embodiment of a microdevice-manufacturing method according to the invention utilizes a projection-exposure system according to the invention for manufacturing the microdevices.

Another embodiment of a projection-exposure system according to the invention includes an illumination system that illuminates a mask and a projection system that projects the pattern of the mask onto a photosensitive substrate. The illumination system comprises correction means for correcting illumination irregularities that arise due to a lack of uniformity of the light-intensity distribution of polarized light at the mask surface or at the surface of the photosensitive substrate. The correction means desirably corrects irregularities occurring due to polarized light polarized in at least one direction among the polarized light polarized in two intersecting directions. The correction means can comprise a first correction member, that corrects illumination irregularities due to light of a first polarization component (among first and second polarization components polarized in two intersecting directions) and a second correction member that corrects illumination irregularities due to light of the second polarization component (among the first and second polarization components polarized in two intersecting directions). The correction means can comprise a third correction member that corrects the optical-intensity difference between light of the first polarization component and light of the second polarization component.

An embodiment of a method of manufacture of an illumination system according to the invention includes a step in which an illumination-optical system is prepared that guides light (desirably EUV light of wavelength of 50 nm or less) to an illumination area. The method also includes a step in which irregularities due to a non-uniform optical intensity distribution of polarized light in the illumination area are corrected. The correction step desirably comprises correcting the irregularities due to polarized light polarized in at least one direction among the polarized light polarized in two intersecting directions. More specifically, in an embodiment, the correction step comprises a first correction step in which the irregularities due to light of a first polarization component (among the light of first and second polarization components polarized in two intersecting directions) is corrected and a second correction step in which the irregularities due to light of the second polarization component (among the light of the first and second polarization components polarized in two intersecting directions) is corrected. The correction step further can comprise a third correction step in which a difference in optical intensity between light of the first polarization component and light of the second polarization component is corrected.

An embodiment of a method for adjusting a projection-exposure system according to the invention comprises a step in which a projection-exposure system is prepared. The projection-exposure system comprises an illumination system that illuminates a mask (desirably with EUV light having a wavelength of 50 nm or less) and a projection system that projects a pattern image of the mask onto a photosensitive substrate. The method further comprises the step of correcting irregularities due to the non-uniform light-intensity distribution of polarized light at the surface of the mask or at the surface of the photosensitive substrate. The correction process can comprise a step in which irregularities, due to polarized light polarized in at least one direction among polarized light polarized in two intersection directions, are corrected. The correction step can comprise a first step in which irregularities due to the light of a first polarization component (among the light of first and second polarization components polarized in two intersecting directions) is corrected and a second step in which irregularities due to the light of the second polarization component (among the light of the first and second polarization components polarized in two intersecting directions) is corrected. The correction step further can comprise a third step in which the difference in optical intensities between light of the first polarization component and light of the second polarization component is corrected.

Another embodiment of a microdevice-manufacturing method utilizes a projection-exposure system that has been adjusted by a projection-exposure-system adjustment method according to the invention. The manufacturing method comprises a step in which a mask is illuminated using the illumination system and a step in which an image of the mask pattern is projected onto the photosensitive substrate using the projection system.

Any of various methods for manufacturing a projection-exposure system according to the invention include any of the various methods, according to the invention, for adjusting a projection-exposure system.

DETAILED DESCRIPTION

Figure 1:
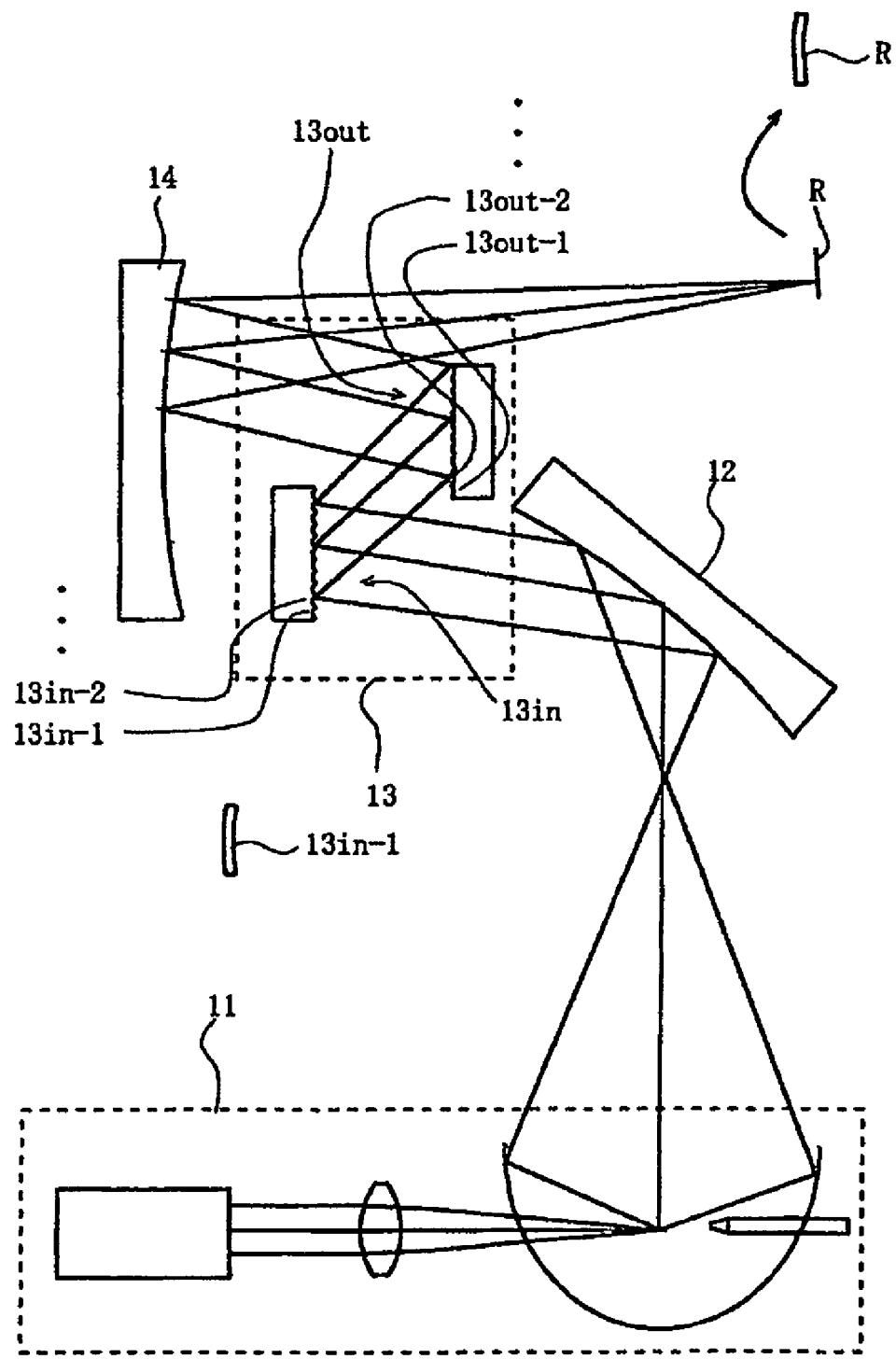
FIG. 1 is an optical diagram of the configuration of an illumination-optical system according to a first aspect of the invention.

Below, aspects of the invention are described with reference to the drawings.

Representative Embodiment of First Aspect

A first aspect of this invention is described below, with reference to FIGS. 1-10. This aspect is exemplified by a representative embodiment of an illumination-optical system, summarized in FIG. 1. The depicted illumination-optical system is a respective portion of a projection-exposure system comprising a primarily reflective projection-optical system. The depicted illumination-optical system illuminates an arc-shaped field of a surface of a reticle R (hereinafter called an "arc field") by Köhler illumination.

The source 11 of light used by this illumination-optical system is a laser-plasma light source that emits EUV light (regarded herein as being EUV light having a wavelength of 50 nm or less). The illumination-optical system includes, sequentially from the emission side of the light source 11, a collimator mirror 12, a fly's-eye mirror 13, and a condenser mirror 14. Of these mirrors, the fly's-eye mirror 13 has an incidence face $13_{in}$ comprising multiple unit mirrors $13_{in}$-1, $13_{in}$-2, ... arranged in parallel, and an emission face $13_{out}$ comprising multiple unit mirrors $13_{out}$-1, $13_{out}$-2, ... arranged in parallel. Here, a "parallel" arrangement means a placement of the unit mirrors such that, of the incident rays incident on the fly's-eye mirrors, different respective portions of the incident rays are manipulated separately by each unit mirror. A "series" arrangement means a placement of unit mirrors such that the entire bundle of incident rays is manipulated in order from one mirror to the next in a sequence.

In an illumination-optical system of this configuration, the beam emitted from the light source 11 is reflected by the collimator mirror 12 and formed thereby into a parallel beam. The beam is then incident on the incidence face $13_{in}$ of the fly's-eye mirror 13. The respective beam portions emitted separately from each of the unit mirrors $13_{in}$-1, $13_{in}$-2, ... of the incidence face $13_{in}$ are separately incident, while being condensed, on the respective unit mirrors $13_{out}$-1, $13_{out}$-2, ... of the emission face $13_{out}$. The respective beam portions reflected by the unit mirrors $13_{out}$-1, $13_{out}$-2, ... are guided to and superposed on the same location (on the reticle surface R) by the condenser mirror 14.

Each reflecting surface of the unit mirrors $13_{in}$-1, $13_{in}$-2, ... of the incidence face $13_{in}$ of the fly's-eye mirror 13 has positive optical power (that is, each reflecting surface is a concave surface) to condense the respective portions of the incident beam. Further, each reflecting surface of the unit mirrors $13_{in}$-1, $13_{in}$-2, ... is shaped so as to have an external profile (outline), as seen from the side of the collimator mirror 12, that is shaped similarly to the illuminated area on the reticle surface R (that is, each reflecting surface is arc-shaped; see FIG. 3, described below).

Moreover, each of the unit mirrors $13_{in}$-1, $13_{in}$-2, ... as well as the other mirrors in the illumination-optical system, comprises a mirror substrate made of glass, ceramic, metal, or other suitable material. On the surface of the mirror substrate two different materials, such as molybdenum (Mo) and silicon (Si), are alternatingly deposited in a repeating manner to form a multilayer film that improves the reflectivity of the mirror.

Figure 2:
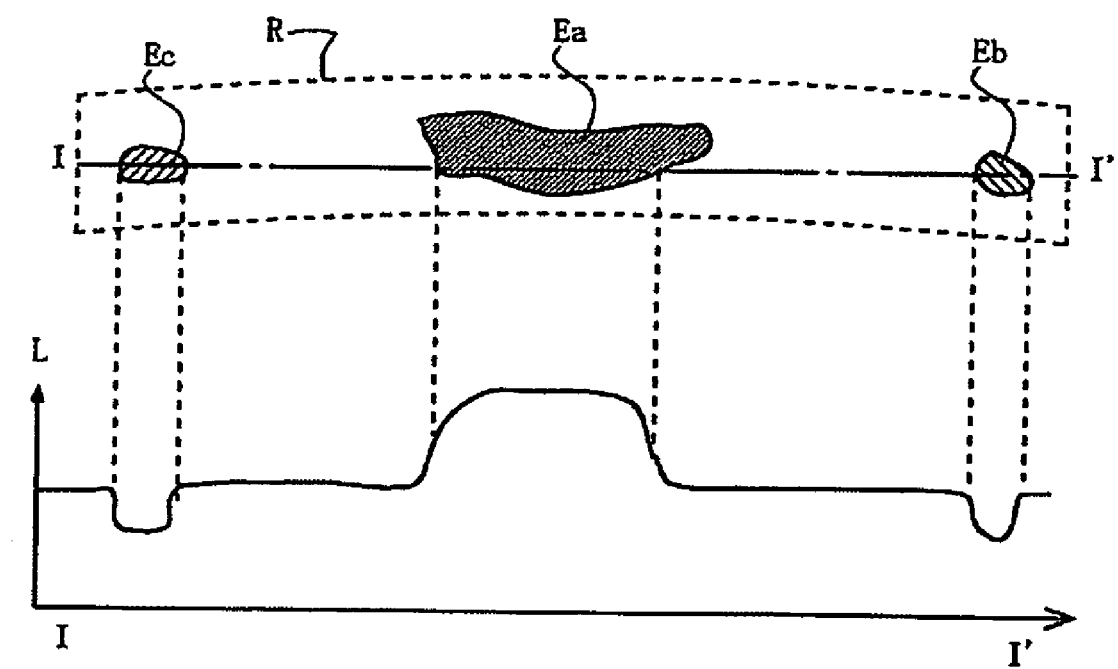
FIG. 2 depicts exemplary illumination irregularities at a reticle surface R prior to correction.

Illumination irregularities in an illumination-optical system having the above configuration are corrected as follows. The illumination-optical system of this embodiment is configured to reduce the effect of certain irregularities at the reticle surface R. Upon measuring the distribution of illumination intensity at the reticle surface R after actual assembly, irregularities are found to occur, as shown for example in FIG. 2. In FIG. 2, in the region Ea on the reticle surface R the illumination intensity is comparatively high relative to other illuminated regions of the reticle surface R. In other regions Eb, Ec the illumination intensity is comparatively low.

Figure 3:
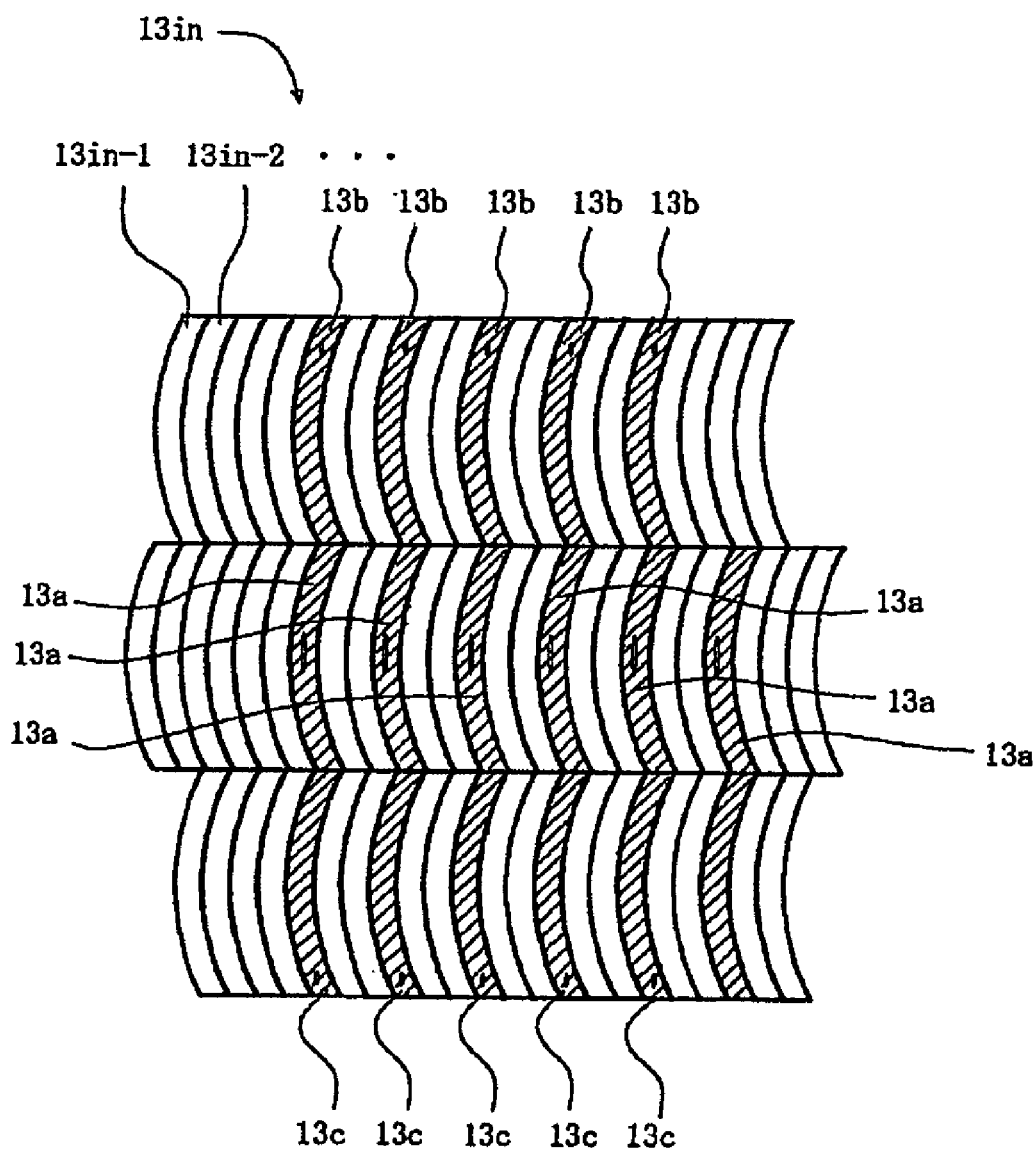
FIG. 3 is a plan view of the incident face $13_{in}$ of the fly's-eye mirror 13 in the system of FIG. 1.

Described below are situations in which illumination irregularities such as those shown in FIG. 2 occur at the reticle surface R. Also described are changes, made in response to the illumination irregularities, to the fly's-eye mirror 13. The incidence face $13_{in}$ of the fly's-eye mirror 13 is shown in FIG. 3. As indicated by the shading in FIG. 3, selected unit mirrors $13_{in}$-1, $13_{in}$-2, . . . of the incidence face $13_{in}$ are replaced with respective correction mirrors 13a, 13b, 13c.

The correction mirrors 13a, 13b, 13c have the same reflecting-surface shape (here, a concave surface) as the shapes of the reflecting surfaces of the respective unit mirrors $13_{in}$-1, $13_{in}$-2, . . . prior to replacement. However, the correction mirrors 13a have reflectivity irregularities that serve to reduce the relative illumination intensity in the "bright" regions Ea on the reticle surface R. Similarly, the correction mirrors 13b have reflectivity irregularities that serve to increase the relative illumination intensity of the "dark" regions Eb on the reticle surface R, and the correction mirrors 13c have reflectivity irregularities that serve to increase the relative illumination intensity of the "dark" regions Ec on the reticle surface R.

Figure 4:
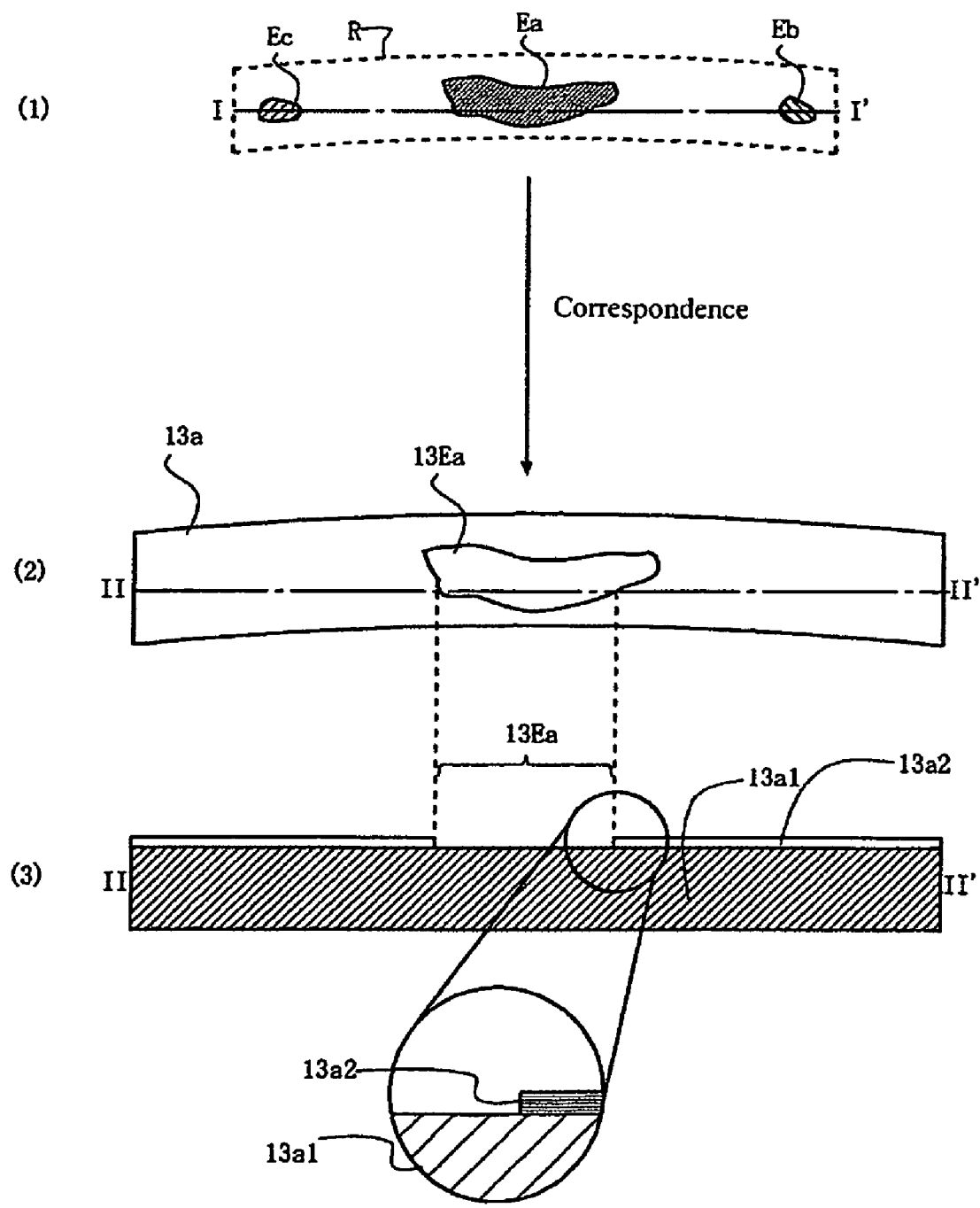
FIG. 4 depicts various features of a correction mirror 13a as used in the fly's-eye mirror of FIG. 3.

The correction mirrors 13a are shown in FIG. 4. FIG. 4(1) shows locations on the reticle surface R corresponding to locations on the reflecting surface of a correction mirror 13a. FIG. 4(2) shows the reflecting surface of a correction mirror 13a, and FIG. 4(3) shows a cross-section of the correction mirror 13a along the line II-II' in FIG. 4(2). The surface (reflecting surface) of the correction mirror 13a is actually concave, but in the cross-sectional view of FIG. 4(3), the surface is depicted as planar for simplicity. (This is also the case in the cross-sectional views in FIGS. 5, 6, 9, and 19, discussed later below.) In FIG. 4(2) the region 13Ea of the reflecting surface of the correction mirror 13a corresponds to the "bright" region Ea on the reticle surface R (FIG. 4(1)). In FIG. 4(3) the cross-section in the region 13Ea of the correction mirror 13a is different from the cross-section in other regions of the correction mirror 13a. Specifically, regions other than 13Ea include a reflective multilayer film 13a2, whereas the region 13Ea has only the mirror substrate 13a1.

The multilayer film 13a2 can comprise layers of Mo, Si, tungsten (W), chromium (Cr), carbon (C), NiCr (nickel chromium), or other suitable material. The mirror substrate 13a1, on which the multilayer film 13a2 is formed, can be made of glass, ceramic, metal, or other suitable material. The correction mirror 13a can be manufactured by first forming a multilayer film 13a2 over the entire mirror substrate 13a1, and then removing the multilayer film 13a2 from the region 13Ea. Alternatively, the correction mirror 13a can be made by masking the area 13Ea on the mirror substrate 13a1 while forming the multilayer film 13a2, and then removing the mask.

Figure 5:
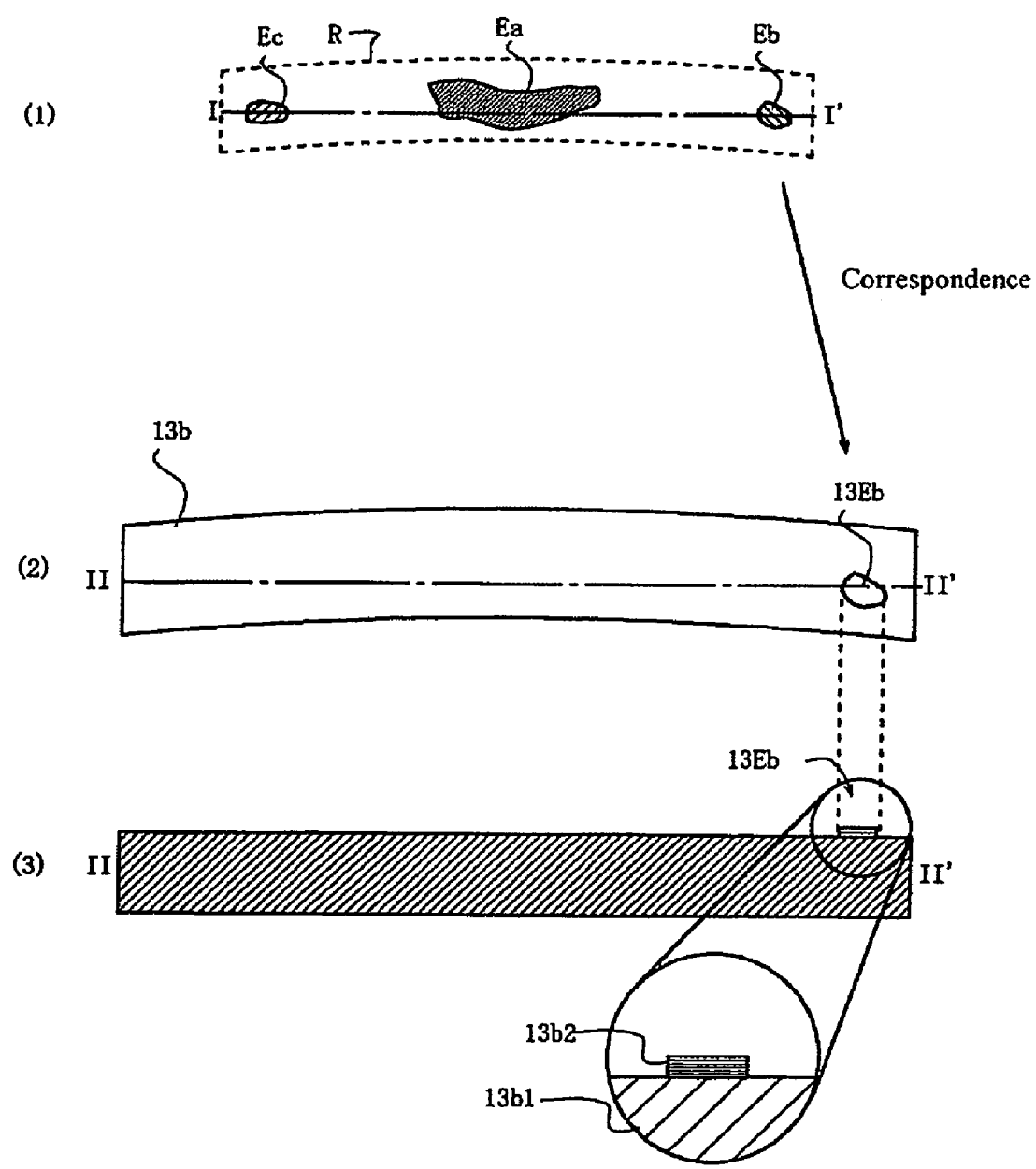
FIG. 5 depicts various features of a correction mirror 13b as used in the fly's-eye mirror of FIG. 3.

The correction mirror 13b is shown in FIG. 5, in which FIG. 5(1) shows locations on the reticle surface R corresponding to locations on the reflecting surface of the correction mirror 13b. FIG. 5(2) shows the reflecting surface of the correction mirror 13b, and FIG. 5(3) shows a cross-section of the correction mirror 13b along line II-II' in FIG. 5(2). In FIG. 5(2) the region 13Eb on the reflecting surface of the correction mirror 13b corresponds to the "dark" region Eb on the reticle surface R (FIG. 5(1)). In FIG. 5(3), the cross-section of the correction mirror 13b in the region 13Eb is different from the cross-section in other areas of the correction mirror. Specifically, a reflective multilayer film 13b2 (e.g., alternating layers of Mo and Si, or other suitable materials) is formed on the mirror substrate 13b1 (e.g., glass, ceramic, metal, or other suitable material) in the region 13Eb. In other regions of the mirror, only the mirror substrate 13b1 is present. The correction mirror 13b can be manufactured by forming the multilayer film 13b2 on the mirror substrate 13b1, then removing the multilayer film 13b2 from regions other than the region 13Eb. Alternatively, regions other than 13Eb on the mirror substrate 13b1 can be masked during formation of the multilayer film 13b2, after which the mask is removed.

Figure 6:
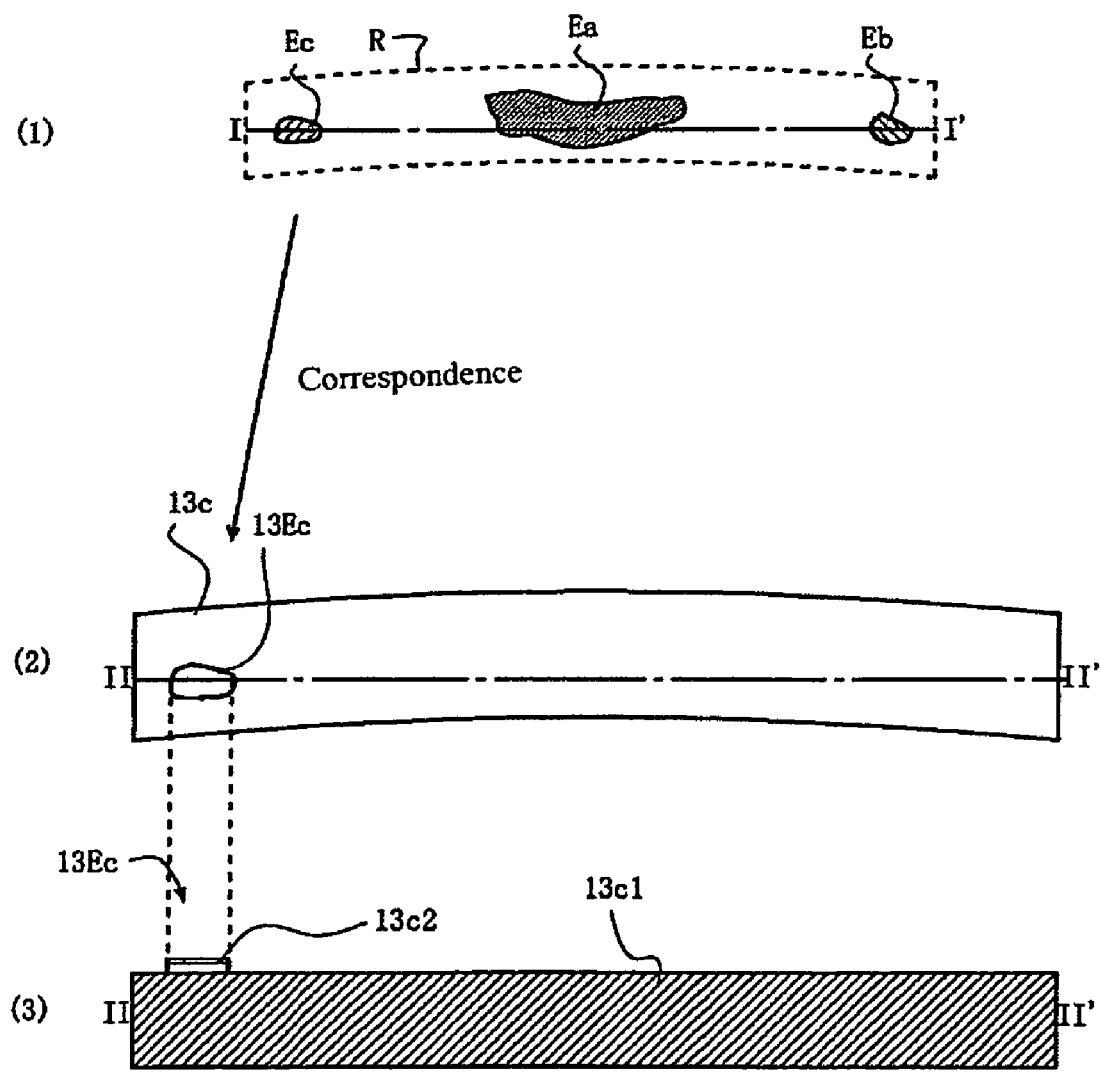
FIG. 6 depicts various features of a correction mirror 13c as used in the fly's-eye mirror of FIG. 3.

The correction mirror 13c is shown in FIG. 6, in which FIG. 6(1) shows locations on the reticle surface R corresponding to locations on the reflecting surface of the correction mirror 13c. FIG. 6(2) shows the reflecting surface of the correction mirror 13c, and FIG. 6(3) shows a cross-section of the correction mirror 13c along line II-II' in FIG. 6(2). In FIG. 6(2) the region 13Ec on the reflecting surface of the correction mirror 13c corresponds to the "dark" region Ec on the reticle surface R (FIG. 6(1)). In FIG. 6(3), the cross-section of the correction mirror 13c in the region 13Ec is different from the cross-section in other regions of the correction mirror. Specifically, a reflective multilayer film 13c2 (e.g., alternating layers of Mo and Si, or other suitable materials) is formed on the mirror substrate 13c1 (e.g., glass, ceramic, metal, or other suitable material) in the region 13Ec. In other regions of the mirror only the mirror substrate 13c1 is present. The correction mirror 13c can be manufactured by forming the multilayer film 13c2 on the mirror substrate 13c1, then removing the multilayer film 13c2 from regions other than 13Ec. Alternatively, regions other than 13Ec on the mirror substrate 13c1 can be masked during formation of the multilayer film 13c2, after which the mask is removed.

Figure 7:
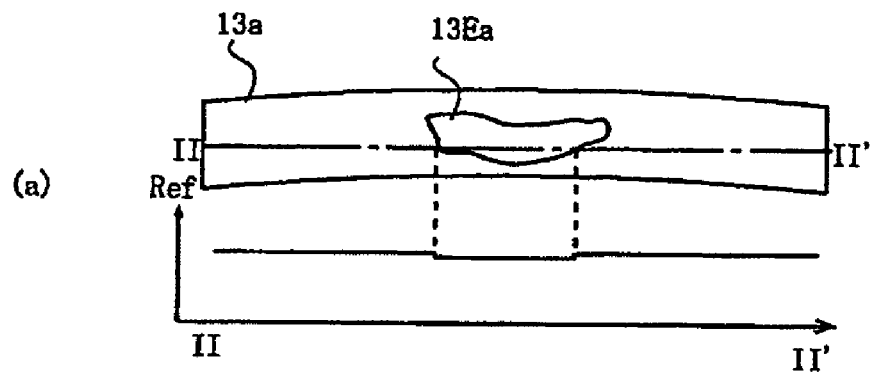
FIG. 7 depicts reflectivity distributions of the correction mirrors 13a, 13b, 13c.
Figure 7:
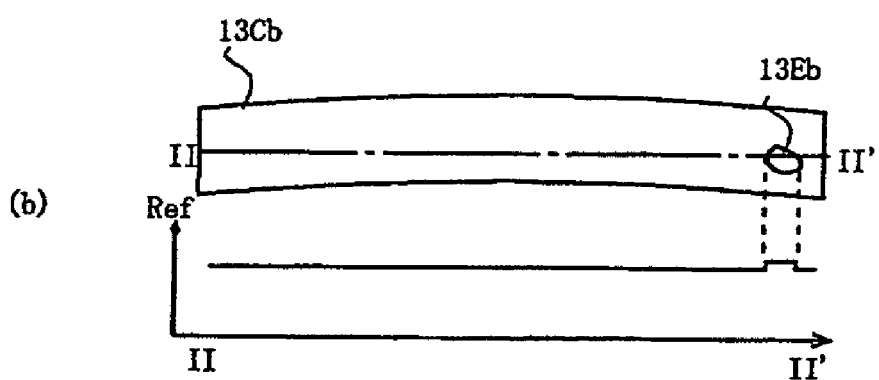
Figure 7:
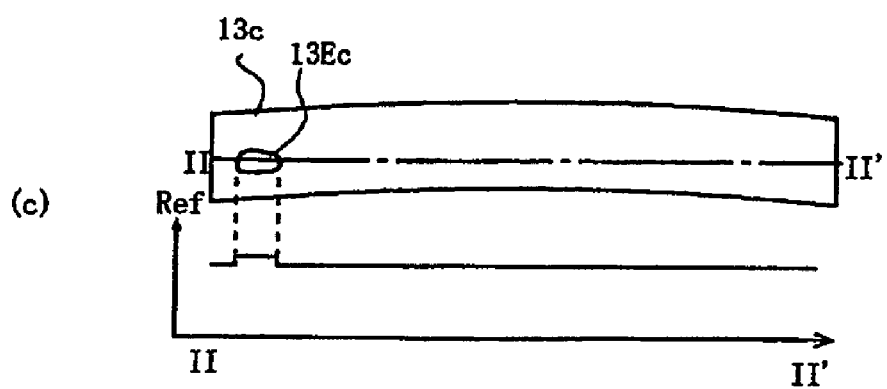

FIG. 7 depicts the reflectivity distribution along the lines II-II' of the correction mirrors 13a, 13b, and 13c. More specifically, FIG. 7(a) shows the reflectivity distribution of the correction mirror 13a, FIG. 7(b) shows the reflectivity distribution of the correction mirror 13b, and FIG. 7(c) shows the reflectivity distribution of the correction mirror 13c. In FIG. 7(a), the reflectivity in the region 13Ea is lower than the reflectivity in other regions of the correction mirror 13a. In FIG. 7(b), the reflectivity in the region 13Eb is higher than the reflectivity in other regions of the correction mirror 13b. In FIG. 7(c), the reflectivity in the region 13Ec is higher than the reflectivity in other regions of the correction mirror 13c.

The number of correction mirrors 13a in the incidence face $13_{in}$ (FIG. 3) of the fly's-eye mirror 13 is optimized according to the extent of brightness (see FIG. 2) in the bright region Ea of the reticle surface R, as measured in advance. Also, the number of correction mirrors 13b in the incidence face $13_{in}$ (FIG. 3) of the fly's-eye mirror 13 is optimized according to the extent of darkness (see FIG. 2) in the dark region Eb of the reticle surface R, as measured in advance, and the number of correction mirrors 13c in the incidence face $13_{in}$ (FIG. 3) of the fly's-eye mirror 13 is optimized according to the extent of darkness (see FIG. 2) in the dark region Ec of the reticle surface R, as measured in advance. These optimizations make substantially uniform the illumination intensity over the reticle surface R, as shown for example in FIG. 8.

Alternative Embodiment of First Aspect

Figure 9:
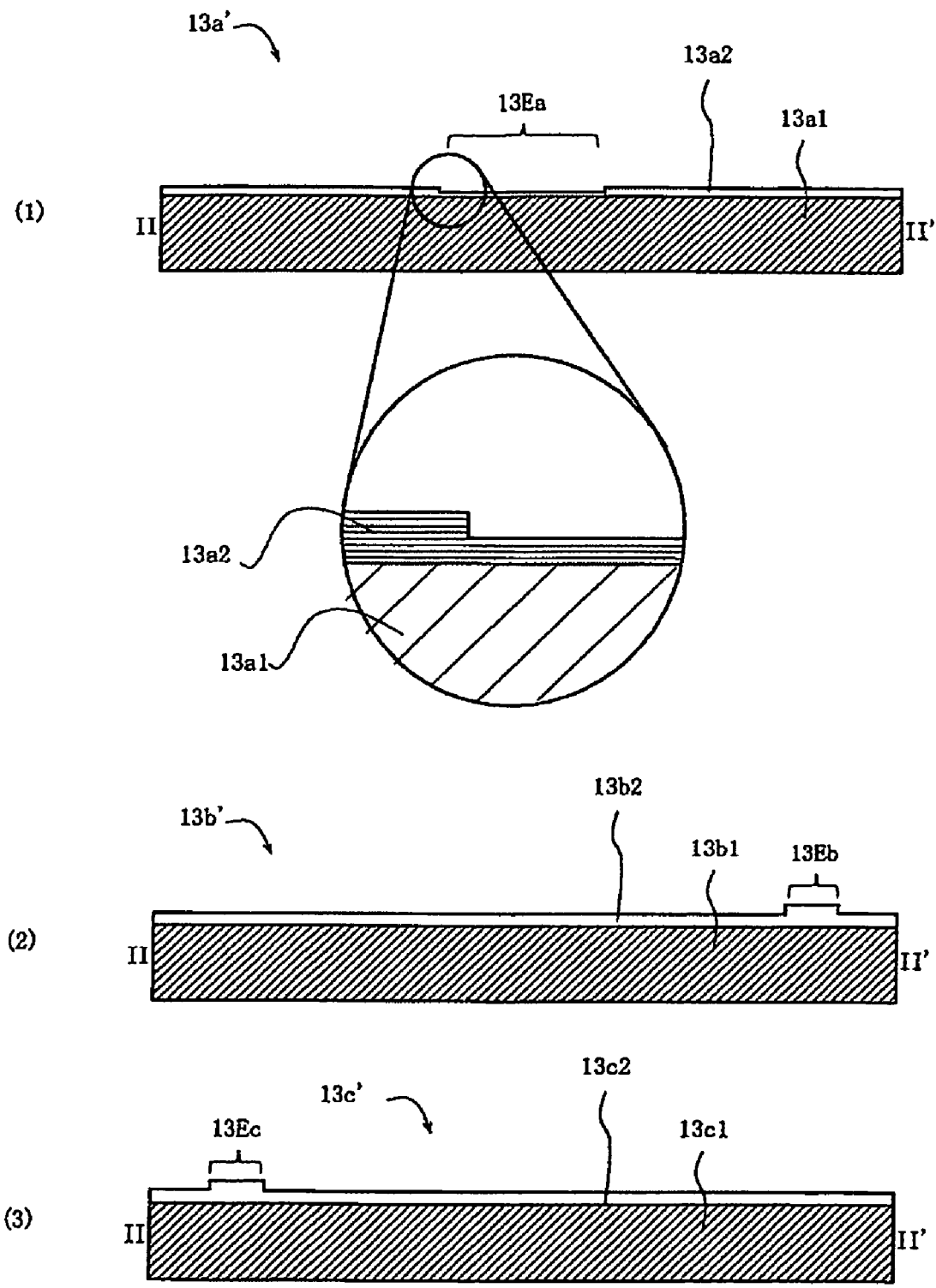
FIG. 9 depicts various features of a fine-adjustment mirror 13a' that can be used instead of a correction mirror 13a for achieving correction in a bright region Ea.

Alternatively to using the above-described correction mirrors 13a in the illumination-optical system of this aspect, fine-adjustment mirrors 13a' such as shown in FIG. 9(1) can be used to achieve precise correction in the bright region Ea. The fine-adjustment mirror 13a' shown in FIG. 9(1) has a shape similar to that of the correction mirror 13a, but differs from the correction mirror 13a in that the multilayer film 13a2 is formed in the region 13Ea also. But, the multilayer film 13a2 in the region 13Ea is thinner than the multilayer film 13a2 outside the region 13Ea. The fine-adjustment mirror 13a' can be manufactured by forming the multilayer film 13a2 on the mirror substrate 13a1, then reducing the thickness of the multilayer film 13a2 only in the region 13Ea.

The fine-adjustment mirror 13a' performs only a small amount of correction compared to the magnitude of correction achieved by the correction mirror 13a. Hence, for example, if using n correction mirrors 13a results in excessive correction and using (n−1) correction mirrors 13a results in insufficient correction, using a fine-adjustment mirror 13a' together with (n−1) correction mirrors 13a yields a fine adjustment of the amount of correction of the bright region Ea.

A fine-adjustment mirror 13a' can be used for performing a fine adjustment of the amount of correction of the bright region Ea (FIG. 9(1)), a fine-adjustment mirror 13b' can be used for performing a fine adjustment of the amount of correction of the dark region Eb (FIG. 9(2)), and a fine-adjustment mirror 13c' can be used for performing a fine adjustment of the amount of correction of the dark region Ec (FIG. 9(3)).

Figure 10:
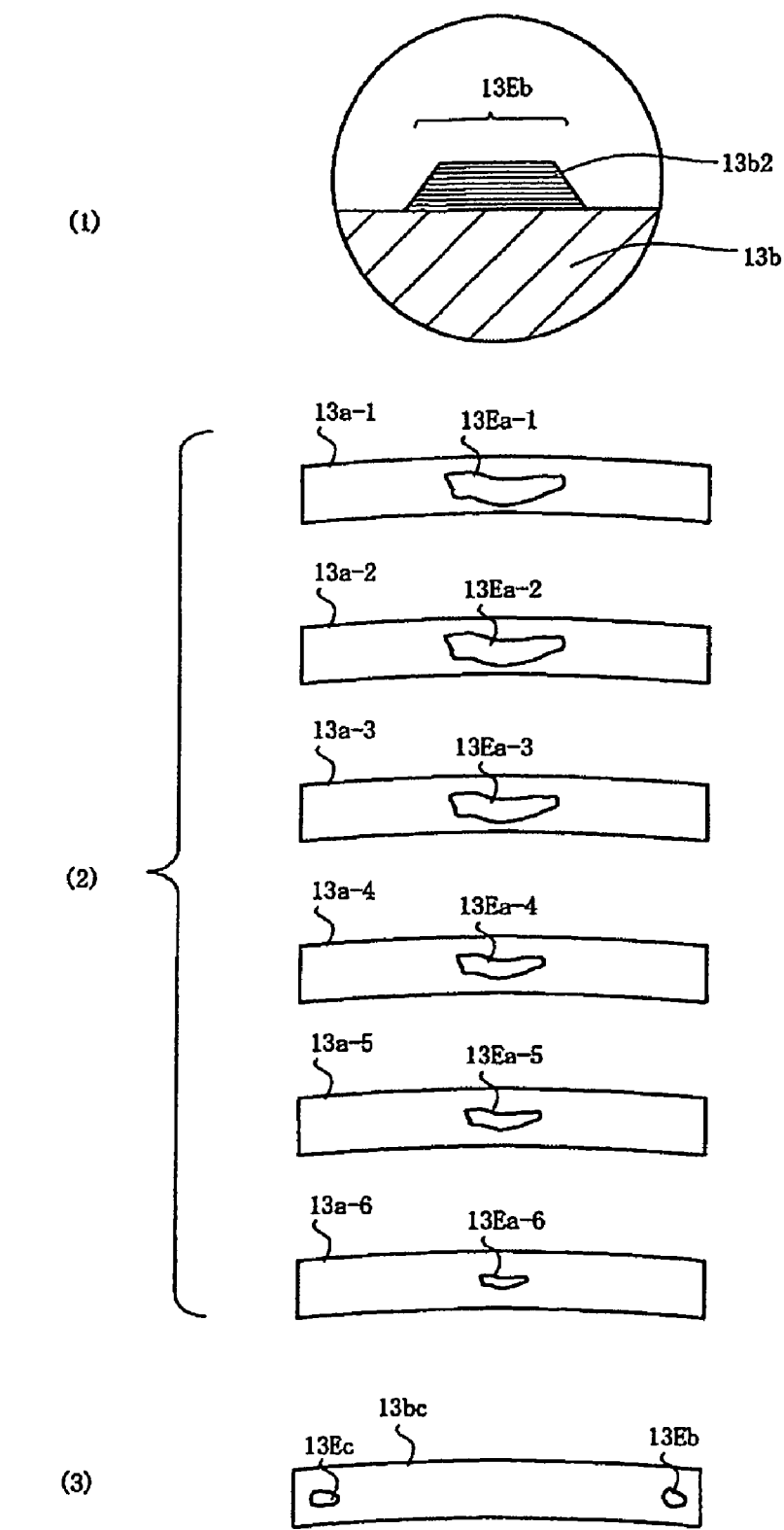
FIG. 10 depicts, in connection with the first aspect, a modified correction mirror of which a multilayer-film region has tapered or sloped sides and a further modification in which multiple correction mirrors 13a-1, 13a-2, 13a-3, . . . are used.

In an illumination-optical system according to this aspect, the correction mirrors 13b can have reflecting surfaces in which the regions 13Eb of the multilayer film 13b2 have tapered or sloped sides, such as shown in FIG. 10(1). As a result of the tapered sides, the slopes of the step portions of the reflectivity-distribution curve shown in FIG. 7(b) are gradual rather than abrupt, which produces a distribution of illumination irregularity that exhibits smooth changes (see FIG. 2). Consequently, the distribution of illumination intensity (see FIG. 8) achieved by the correction mirror is made more uniform. In a similar manner, tapered sides can be formed in the uppermost layers of the reflecting surfaces of the correction mirrors 13a and 13c.

So far, in this embodiment, only one configuration of correction mirror (i.e., the correction mirror 13a) has been used for correcting the bright regions Ea. Alternatively, as shown in FIG. 10(2), multiple (i.e., multiple types of) configurations of correction mirrors 13a-1, 13a-2, 13a-3, . . . can be used. The correction mirrors 13a-1, 13a-2, 13a-3, . . . shown in FIG. 10(2) have respective regions 13Ea-1, 13Ea-2, 13Ea-3, . . . exhibiting low reflectivity. The regions 13Ea-1, 13Ea-2, 13Ea-3, . . . are situated, in their respective mirrors, in substantially the same positions as the region 13Ea, but the respective sizes of the regions 13Ea-1, 13Ea-2, 13Ea-3, . . . are somewhat different from each other and from the region 13Ea. (Note gradual diminution in size of these regions from mirror 13a-1 to 13a-6). Despite this change in size, the external shapes of each of the regions 13Ea-1, 13Ea-2, 13Ea-3, . . . correspond to the contour of the corresponding illumination-irregularity distribution on the reticle surface R (FIG. 2).

By using these correction mirrors 13a-1, 13a-2, 13a-3, . . . the slope of the step portion of the reflectivity-distribution curve shown in FIG. 7(b) is made gradual. As a result, illumination-irregularity distributions exhibiting smooth changes (FIG. 2) are achieved, and the resulting distribution of illumination intensity (FIG. 8) is made more uniform. In a similar manner, multiple types of correction mirrors 13b can be used for correcting the dark regions Eb, and multiple types of correction mirrors 13c can be used for correcting the dark regions Ec.

In this aspect, the multilayer film 13a2 is eliminated or made thinner in the region 13Ea so as to lower, in a relative manner, the reflectivity in the region 13Ea of the correction mirror 13a. Alternatively, the reflectivity can be relatively reduced by, for example, applying a low-reflectivity material to the multilayer film 13a2 in the region 13Ea or by forming fine scratches or grooves in the surface of the multilayer film 13a2 in the region 13Ea.

Similarly, to lower the reflectivity in regions other than 13Eb of the correction mirror 13b, a low-reflectivity material can be applied to the multilayer film 13b2 in these other regions, or fine scratches or grooves can be formed in the surface of the multilayer film 13b2 in these other regions. Further similarly, to lower the reflectivity in regions other than 13Ec of the correction mirror 13c, a low-reflectivity material can be applied to the multilayer film 13c2 in these other regions, or fine scratches or grooves can be formed in the surface of the multilayer film 13c2 in these other regions.

In this aspect, individual correction mirrors 13a, 13b, 13c are used for respectively correcting the bright region Ea, the dark region Eb, and the dark region Ec. Alternatively, as shown in FIG. 10(3), a correction mirror 13bc can be used that simultaneously corrects two or more regions (for example, the dark regions Eb and Ec).

Further, in the illumination-optical system according to this aspect, the unit mirrors $13_{in}$-1, $13_{in}$-2, . . . of the incidence face $13_{in}$ of the fly's-eye mirror 13 are equivalent to each other. Consequently, unit mirrors replaced by respective correction mirrors 13a, 13b, 13c may in principle be any kind of unit mirrors. However, whenever a change is made in an illumination condition, such as a change the size or shape of an aperture diaphragm, it is desirable that optimal unit mirrors be selected that provide a desired corrective effect on illumination irregularities regardless of the change in illumination condition.

Further, in the illumination-optical system according to this aspect, the unit mirrors replaced by the correction mirrors 13a, 13b, 13c have been described as being the unit mirrors $13_{in}$-1, $13_{in}$-2, $13_{in}$-3, . . . , respectively, in the incidence face $13_{in}$ of the fly's-eye mirror 13. Alternatively or in addition, the unit mirrors $13_{out}$-1, $13_{out}$-2, $13_{out}$-3, . . . of the emission face $13_{out}$ may be replaced in this manner. Desirably, the replaced mirrors are the unit mirrors $13_{in}$-1, $13_{in}$-2, . . . of the incidence face $13_{in}$ because the reflecting surfaces of the unit mirrors $13_{in}$-1, $13_{out}$-2, . . . are in a substantially conjugate relationship with the reticle surface R. Consequently, the pattern of the region 13Ea of the correction mirror 13a is substantially similar to the pattern of the bright region Ea of the reticle surface R, the pattern of the region 13Eb of the correction mirror 13b is substantially similar to the pattern of the dark region Eb of the reticle surface R, and the pattern of the region 13Ec of the correction mirror 13c is substantially similar to the pattern of the dark region Ec of the reticle surface R.

Representative Embodiment of Second Aspect

A second aspect of this invention is explained below, with reference to FIGS. 11-18. This aspect is exemplified by a representative embodiment of an illumination-optical system, summarized in FIG. 11. The depicted illumination-optical system is a respective portion of a projection-exposure system comprising a primarily reflective projection-optical system. The depicted illumination-optical system illuminates an arc field of a surface of a reticle R by Köhler illumination.

The source 21 of light used by this illumination-optical system emits EUV light (regarded herein as being EUV light having a wavelength of 50 nm or less). The light source can be, for example, a discharge-plasma source. The illumination-optical system includes, sequentially from the emission side of the light source 21, a collimator mirror 22, a fly's-eye mirror 23, and a condenser mirror 24. The collimator mirror 22 comprises multiple unit mirrors 22-1, 22-2, . . . placed substantially parallel to the incident beam. The fly's-eye mirror 23 comprises an incidence face $23_{in}$ comprising multiple unit mirrors $23_{in}$-1, $23_{in}$-2, . . . placed parallel to each other, and an emission face $23_{out}$ comprising multiple unit mirrors $23_{out}$-1, $23_{out}$-2, . . . placed parallel to each other. The condenser mirror 24 comprises multiple unit mirrors 24-1, 24-2, . . . placed in series with respect to the incident beam.

The orientations of the unit mirrors 22-1, 22-2, . . . , $23_{in}$-1, $23_{in}$-2, . . . , $23_{out}$-1, $23_{out}$-2, . . . , 24-1, 24-2, . . . are such that the respective oblique-incidence angles (angles of the reflecting surfaces relative to the incident beam, here EUV light of wavelength 50 nm or less) of light incident on the respective reflecting surfaces are all angles of total reflection. The reflectivity in ideal "total" reflection is 100%. But, in actuality some degree of loss of light flux is unavoidable. Hence, as used herein, "total reflection" means reflection with a reflectivity of 80% or higher. An oblique angle of incidence providing total reflection of the incident light is called a "total-reflection angle."

The elements Mo or Ru are used on the reflecting surfaces of each of the unit mirrors 22-1, 22-2, . . . , $23_{in}$-1, $23_{in}$-2, . . . , $23_{out}$-1, $23_{out}$-2, . . . , 24-1, 24-2, . . . . Mo and Ru are representative of materials used in making EUV-reflecting surfaces. In both cases, the smaller the oblique angle of incidence of incident light, the higher will be the reflectivity. The total-reflection angle for Mo is approximately 15° or less, and the total-reflection angle for Ru is approximately 15° or less. For comparison, the total-reflection angle of molybdenum disilicide ($MoSi_2$) is less than approximately 10°. Hence, the total-reflection angles of the unit mirrors 22-1, 22-2, . . . , $23_{in}$-1, $23_{in}$-2, . . . , $23_{out}$-1, $23_{out}$-2, . . . , 24-1, 24-2, . . . , of which the reflecting surfaces are made of Mo or Ru, are comparatively large, namely 15° or less.

In the illumination-optical system of this aspect, in instances in which intensity differences due to differences in reflectivity between s- and p-polarized light is a problem, $MoSi_2$ may be used on a portion of or on all of the reflecting surfaces.

Figure 12:
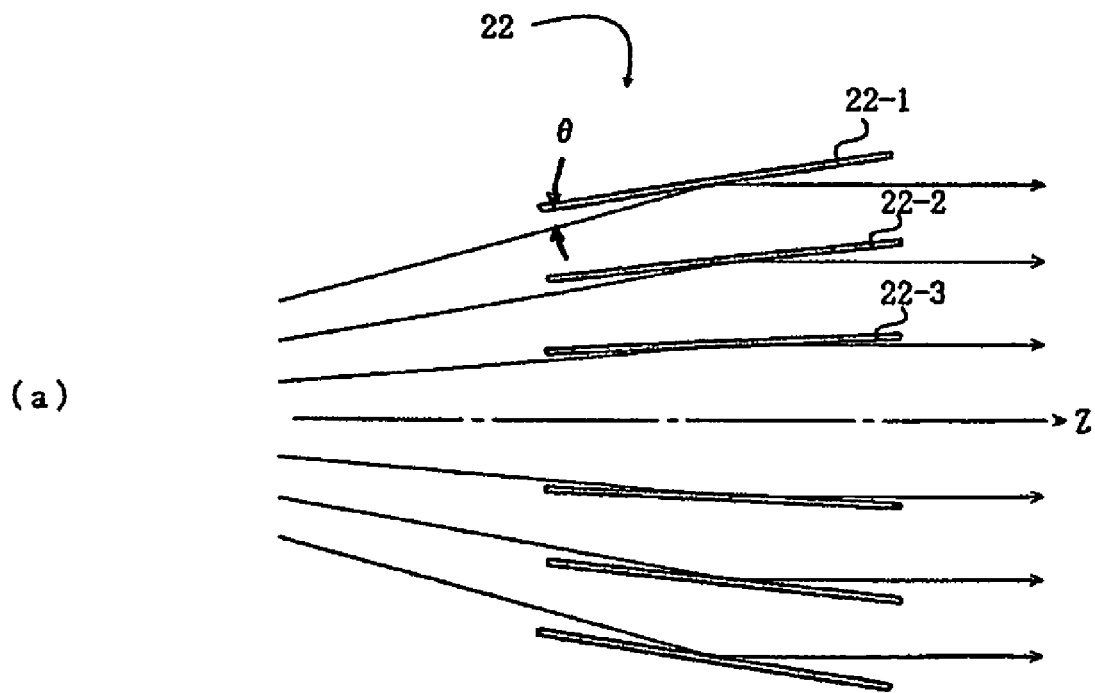
FIG. 12 depicts certain details of the collimator mirror 22 used in the system shown in FIG. 11.
Figure 12:
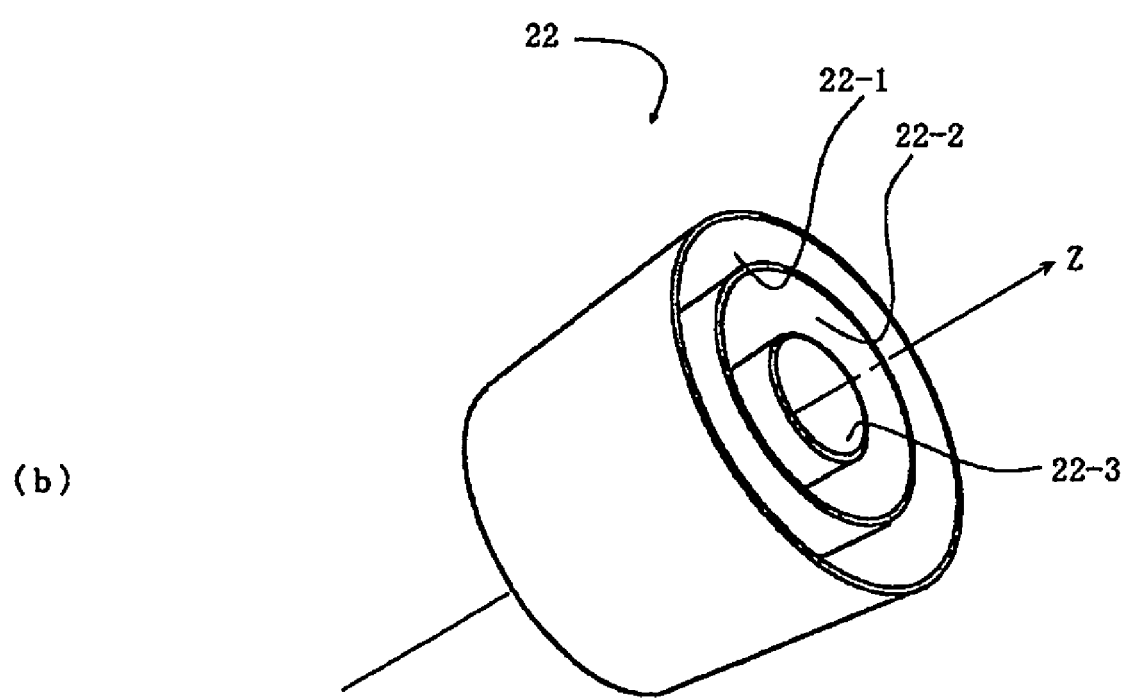

An exemplary collimator mirror 22 according to this aspect is shown in FIG. 12, in which FIG. 12(a) is a cross-sectional view along a median sagittal plane (crossing the optical axis Z), and FIG. 12(b) is an oblique view of the collimator mirror 22. As shown in FIG. 12(a), the collimator mirror 22 comprises multiple skirt-shaped unit mirrors 22-1, 22-2, . . . having different respective diameters and broadening angles. The unit mirrors 22-1, 22-2, . . . extend around the optical axis Z such that their respective larger diameters face the emission direction. In the drawing, the number of unit mirrors 22-1, 22-2, 22-3 is shown as three by way of example.

Each unit mirror 22-1, 22-2, 22-3 has an interior reflecting surface. For converting an incident beam into a parallel beam, the greater the number of unit mirrors that polarize peripheral beams (that is, outwardly disposed unit mirrors having larger diameters), the greater the broadening angle that can be made. As shown in FIGS. 12(a) and 12(b), the reflecting surfaces of the unit mirrors 22-1, 22-2, 22-3 are each in the shape of a partial side face of a cone. Thus, the collimator mirror 22 comprising these unit mirrors 22-1, 22-2, . . . converts rays emitted from the light source 21 at different emission angles into respective parallel beams.

Figure 13:
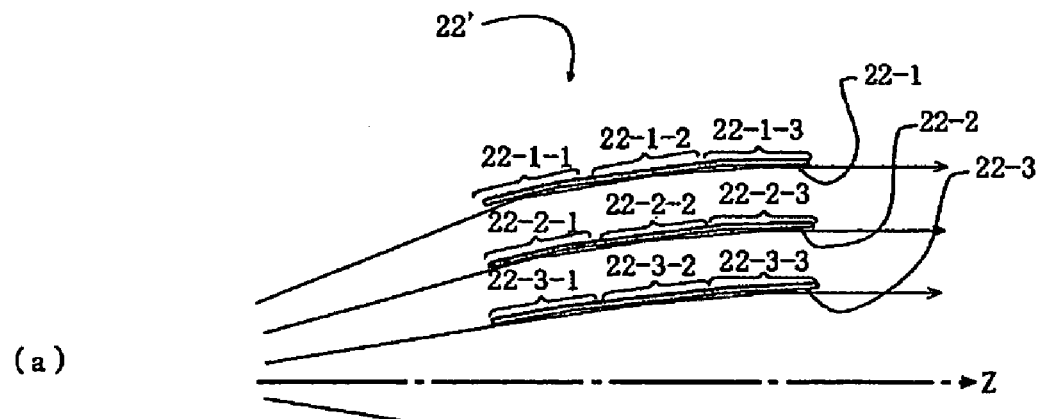
FIG. 13 depicts certain details of a modified collimator mirror 22'.
Figure 13:
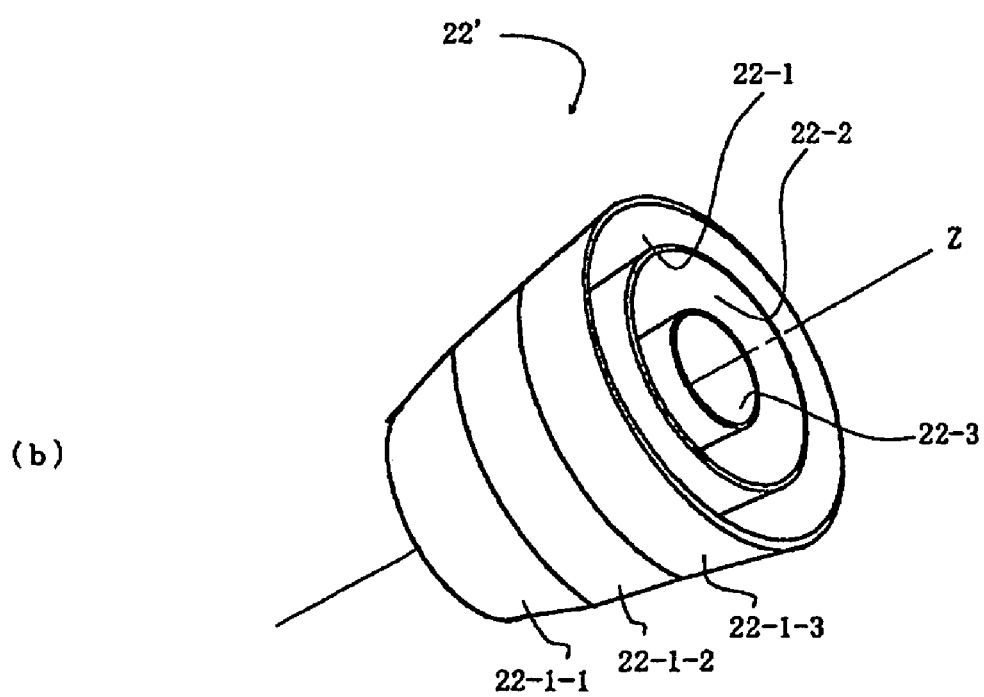

In an alternative embodiment, the collimator mirror 22 can have the configuration of the collimator mirror 22' shown in FIG. 13, in which FIG. 13(a) is a cross-sectional view along a median sagittal plane (crossing the optical axis Z), and FIG. 13(b) is an oblique view of the collimator mirror 22'. The unit mirror 22-1, situated at the outer periphery of the collimator mirror 22', comprises multiple unit mirrors 22-1-1, 22-1-2, . . . arranged in series (in FIG. 13, the number of unit mirrors placed in series is three, by way of example). Each of the unit mirrors 22-1-1, 22-1-2, . . . has a skirt shape, analogous to the unit mirror 22-1 of the collimator mirror 22 shown in FIG. 12, with the reflecting surface being in the shape of a partial side face of a cone.

The unit mirrors 22-1-1, 22-1-2, 22-1-3, . . . convert incident light into rays that propagate parallel to the optical axis Z by reflecting, in sequence, incident light from the light source 21. Similarly, each of the unit mirrors 22-2, 22-3, . . . , situated inboard of the unit mirror 22-1, comprises multiple unit mirrors arranged in series (22-2-1, 22-2-2, 22-2-3 and 22-3-1, 22-3-2, 22-3-3).

Next, the fly's-eye mirror 23 (FIG. 11) is described. As explained above, the unit mirrors $23_{in}$-1, $23_{in}$-2, . . . , $23_{out}$-1, $23_{out}$-2, . . . of the fly's-eye mirror 23 are oriented such that the angle of incidence of light on each unit mirror is a total-reflection angle (here, 15° or less). Consequently, the incidence face $23_{in}$ and the emission face $23_{out}$ of the fly's-eye mirror 23 are positioned so as to provide a sufficient interval for the light reflected by the respective unit mirrors of each.

Figure 14:
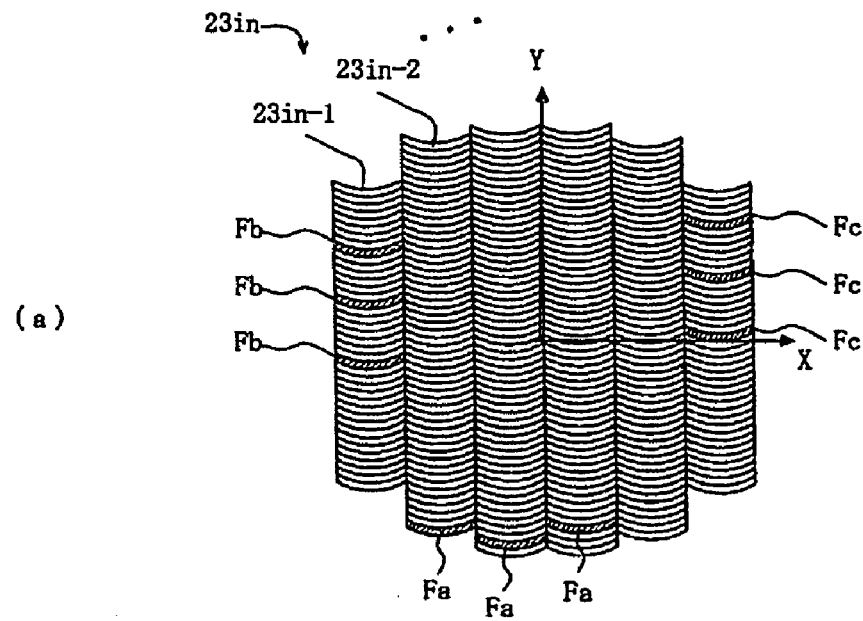
FIG. 14 depicts certain details of the fly's-eye mirror 23 used in the system shown in FIG. 11.
Figure 14:
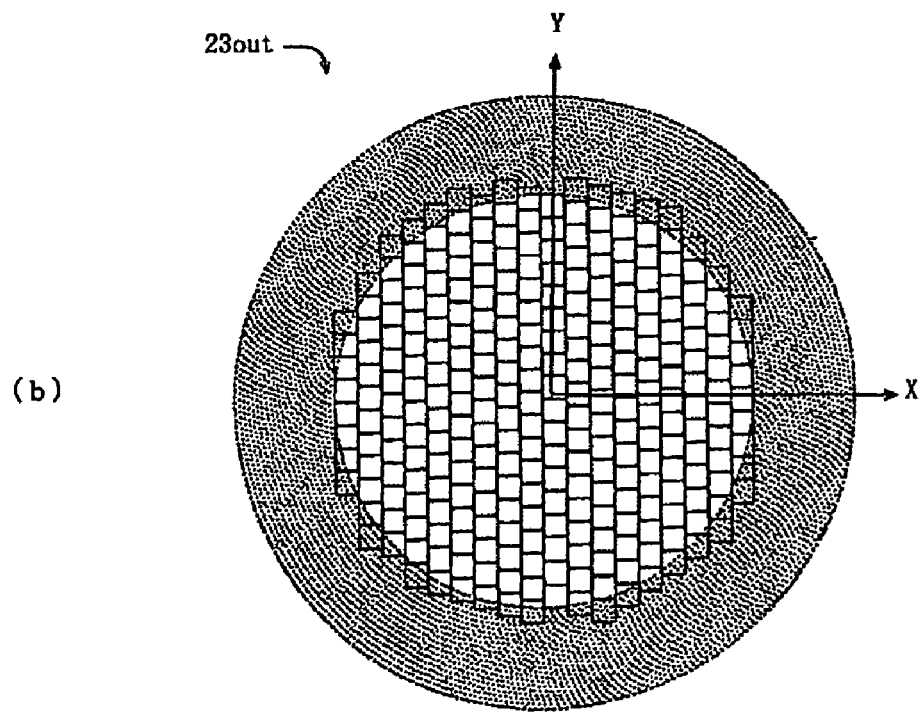

Details of the fly's-eye mirror 23 are shown in FIG. 14, of which FIG. 14(a) depicts the incidence face $23_{in}$ of the fly's-eye mirror 23, and FIG. 14(b) depicts the emission face $23_{out}$ of the fly's-eye mirror 23. FIG. 14(a) presents a view of the incidence face $23_{in}$ as viewed from the collimator mirror 22, and FIG. 14(b) presents a view of the emission face $23_{out}$ as viewed from the condenser mirror 24.

Figure 15:
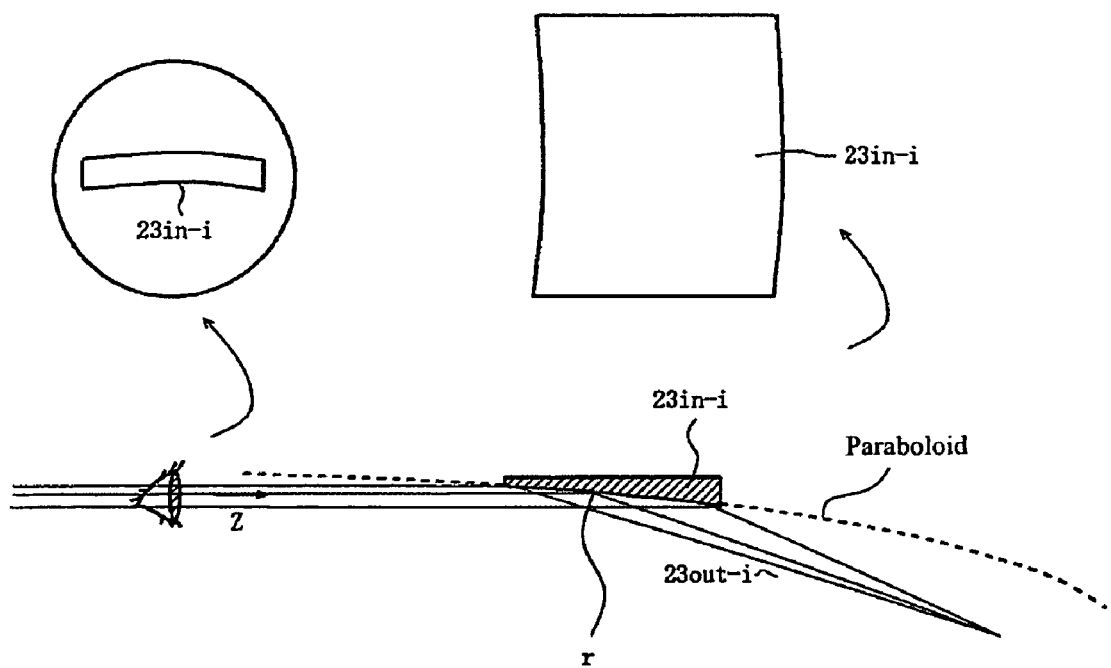
FIG. 15 depicts the shapes of the reflecting surfaces of the unit mirrors $23_{in}$-1, $23_{in}$-2, ... of the incidence face $23_{in}$ of the fly's-eye mirror 23.

FIG. 15 details the shapes of the reflecting surfaces r of the unit mirrors $23_{in}$-1, $23_{in}$-2, . . . of the incidence face $23_{in}$ of the fly's-eye mirror 23. The reflecting surfaces r of the unit mirrors $23_{in}$-1, $23_{in}$-2, . . . are each shaped as a respective portion of a paraboloid of which the main axis is parallel to the optical axis Z and the apex is directed toward the emission side. The periphery (see the upper-right in FIG. 15) of the reflecting surfaces r of the unit mirrors $23_{in}$-1, $23_{in}$-2, . . . is configured so as to have a shape, as viewed from the side of the collimator mirror 22 (see upper-left in FIG. 15) similar to the shape of the reticle surface R (i.e., an arc shape).

The condenser mirror 24 (see FIG. 11) reflects beams emitted from the emission face $23_{out}$. The condenser mirror 24 comprises unit mirrors 24-1, 24-2, . . . that reflect the beams sequentially. The reflected beams are superposed and projected (as from a secondary light-source group formed at the emission face $23_{out}$) onto the reticle surface R (here, an arc-shaped field). The reflecting surface of at least one of these unit mirrors 24-1, 24-2, . . . is an aspherical toroidal surface.

Correction of illumination irregularities in an illumination-optical system is performed with this embodiment as follows. Although the illumination-optical system is designed to reduce illumination irregularities at the reticle surface R, measurements (of the distribution of illumination intensity at the reticle surface R) performed after actual assembly of the illumination-optical system inevitably reveal some illumination irregularities.

Figure 11:
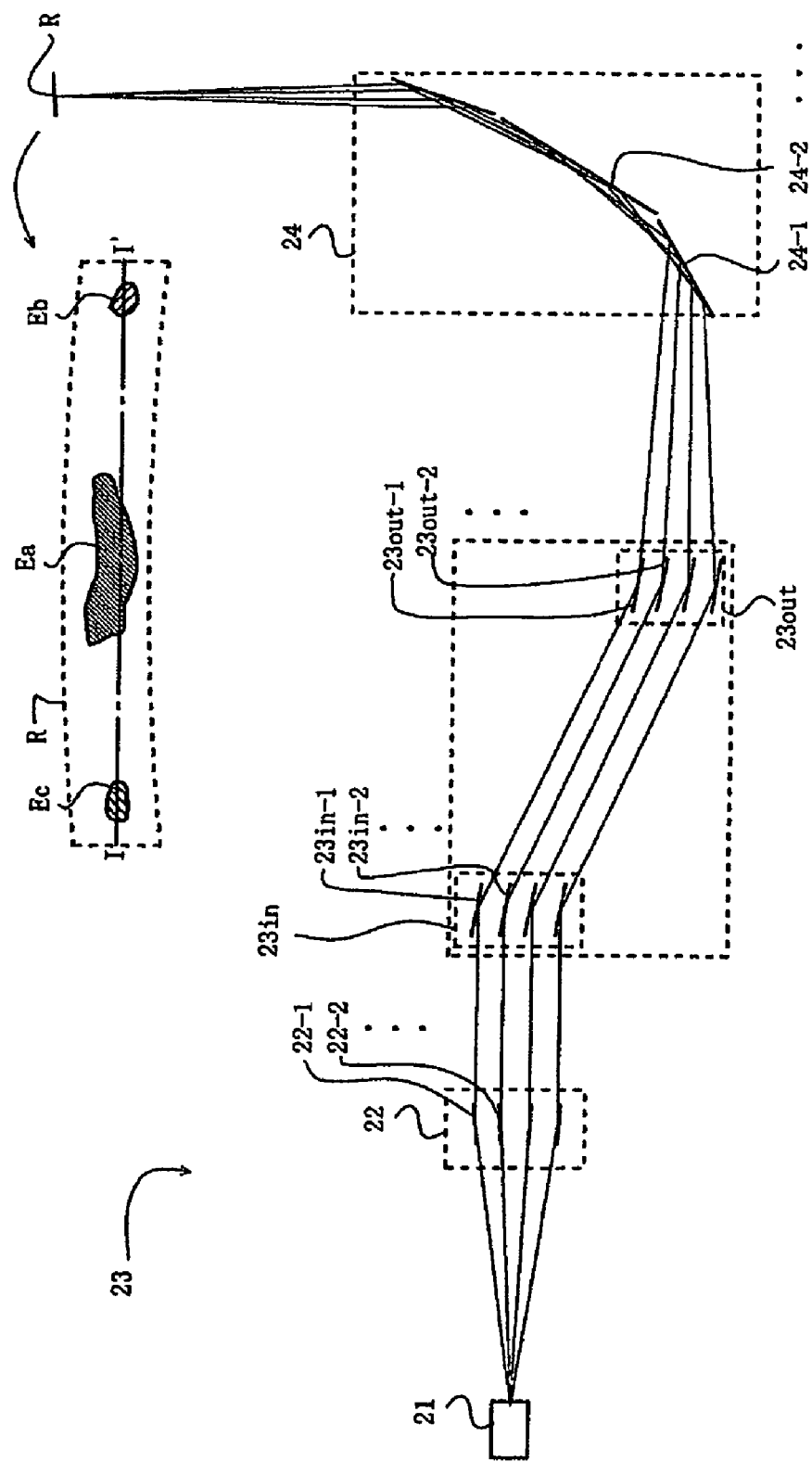
FIG. 11 is an optical diagram of the configuration of an illumination-optical system according to a second aspect of the invention.

First, a case is considered in which illumination irregularities occur in the same manner as in the first aspect (see FIG. 2), in which the distribution of illumination intensity reveals a "bright" region Ea and two "dark" regions Eb and Ec; see top of FIG. 11. In response to these illumination irregularities, the following changes are made to the fly's-eye mirror 23 of this embodiment. As indicated by the shading in FIG. 14(a), some of the unit mirrors, among the unit mirrors $23_{in}$-1, $23_{in}$-2, ... of the incidence face $23_{in}$ of the fly's-eye mirror 23, are covered with respective incidence-side correction filters Fa, Fb, Fc.

The correction filter Fa includes a transmissivity irregularity that relatively reduces the illumination intensity in the bright region Ea on the reticle surface R. The correction filter Fb includes a transmissivity irregularity that relatively improves the illumination intensity in the dark region Eb on the reticle surface R, and the correction filter Fc includes a transmissivity irregularity that relatively improves the illumination intensity in the dark region Ec on the reticle surface R.

Figure 16:
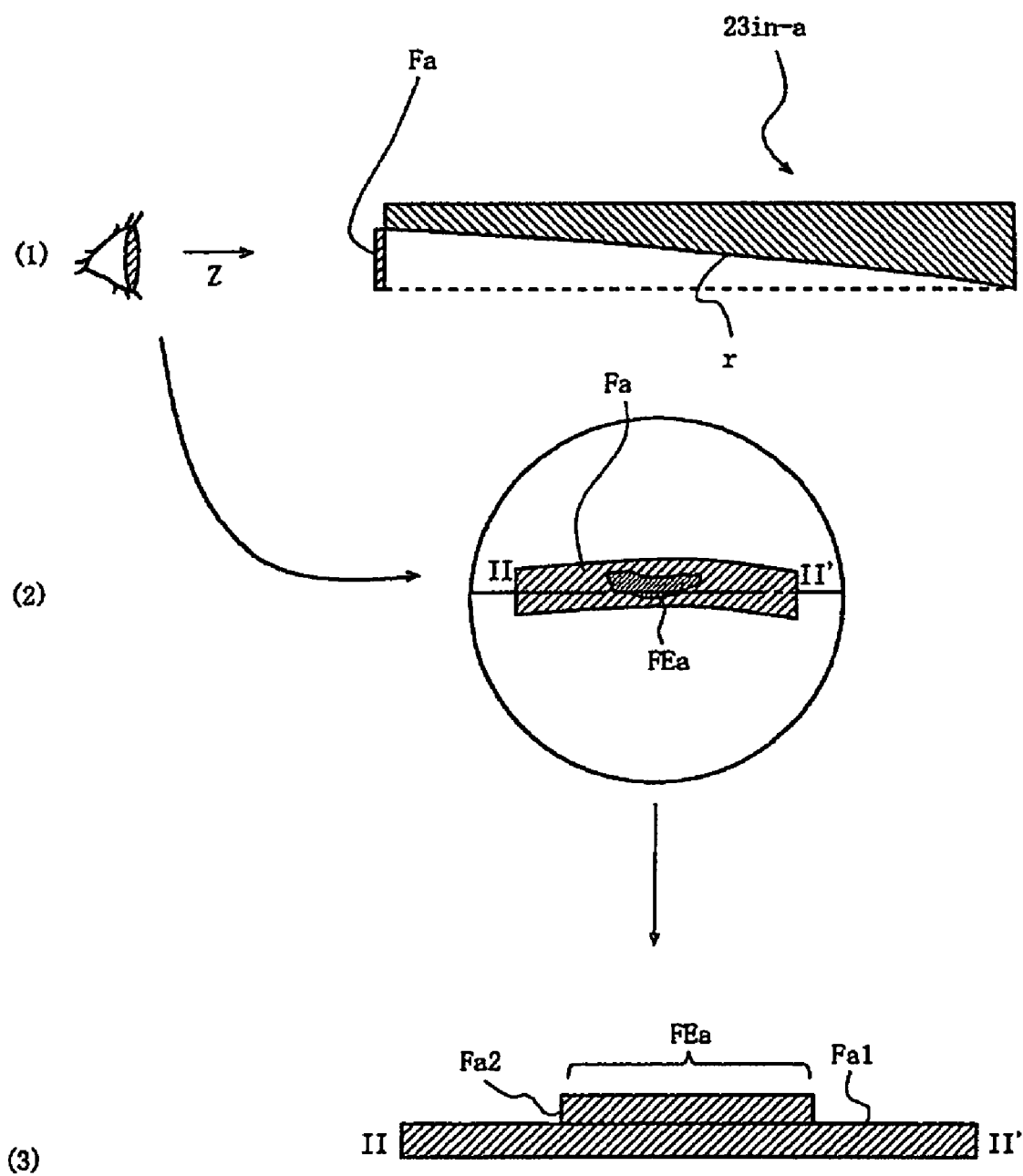
FIG. 16 depicts certain details of a correction filter Fa used in conjunction with a unit mirror $23_{in}$-a of the fly's eye mirror 23.

The correction filter Fa is shown in FIG. 16, of which FIG. 16(1) shows the positional relationship between the unit mirror $23_{in}$-a and the correction filter Fa (which "covers" the unit mirror $23_{in}$-a). FIG. 16(2) shows the correction filter Fa as viewed from the collimator mirror 22, and FIG. 16(3) schematically shows a cross-section of the correction filter Fa along the line II-II' in FIG. 16(2).

As shown in FIG. 16(1), the correction filter Fa is situated perpendicularly to the incident beam (which is a parallel beam) incident on the reflecting surface r of the unit mirror $23_{in}$-a. As shown in FIG. 16(2), the correction filter Fa, as viewed from the collimator filter 22, has a profile similar to the profile of the reflecting surface r as viewed from the collimator mirror 22 (i.e., an arc shape). In FIG. 16(2), the region on the correction filter Fa denoted by the symbol FEa corresponds to the bright region Ea on the reticle surface R. In FIG. 16(3), the cross-section of the region FEa of the correction filter Fa differs from the cross-section in other regions. For example, whereas regions other than the region FEa comprise a thin layer of Be, the region FEa comprises a thick layer of Be. The correction filter Fa can be manufactured by first preparing a substrate Fa1 from Be. A Be layer Fa2 is formed on the substrate Fa1 only in the region FEa.

Figure 17:
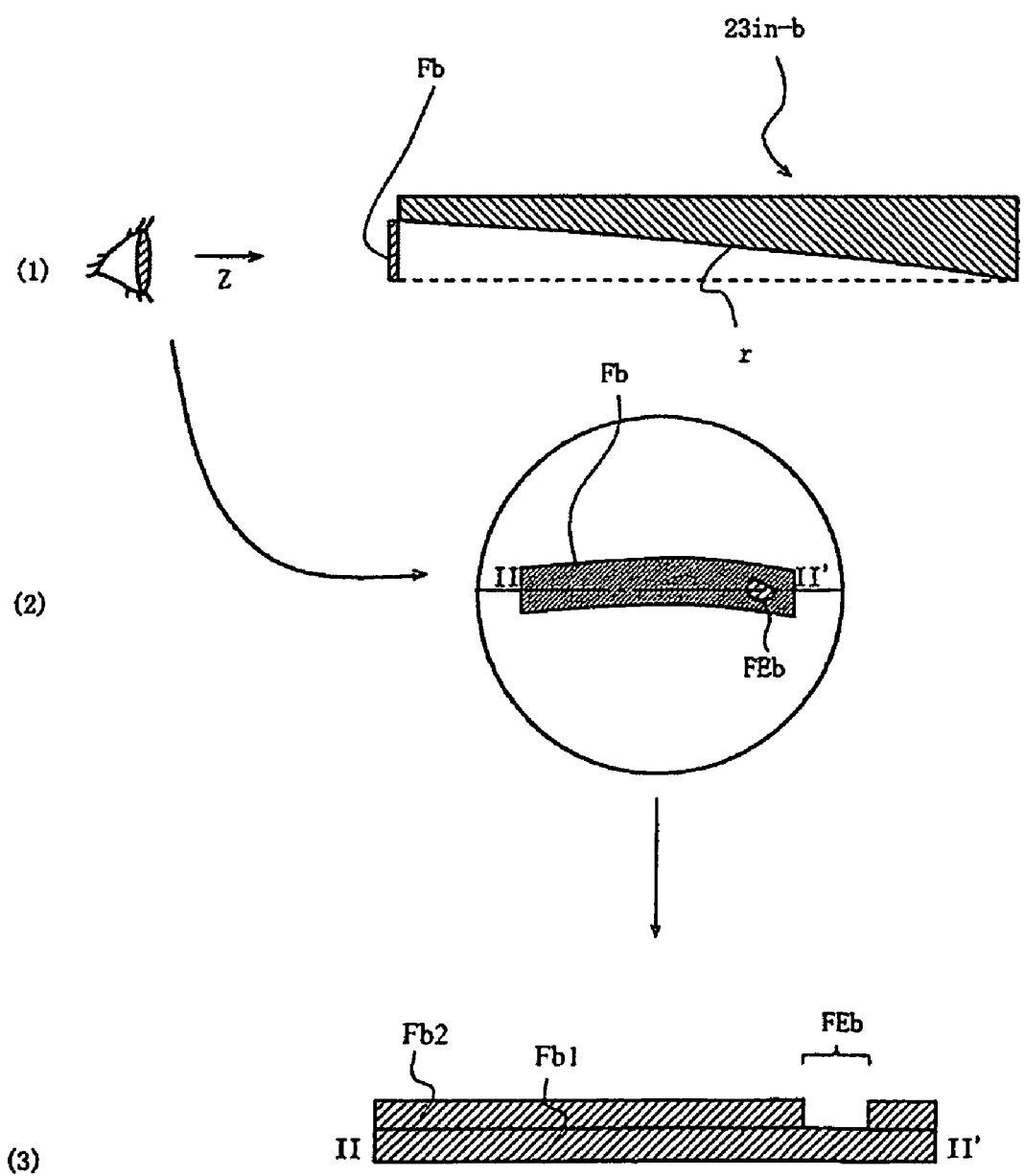
FIG. 17 depicts certain details of a correction filter Fb used in conjunction with a unit mirror $23_{in}$-b of the fly's-eye mirror 23.

The correction filter Fb is shown in FIG. 17, of which FIG. 17(1) depicts the positional relationship between the unit mirror $23_{in}$-b and the correction filter Fb. FIG. 17(2) depicts the correction filter Fb as viewed from the collimator mirror 22, and FIG. 17(3) schematically depicts a cross-section of the correction filter Fb along the line II-II' in FIG. 17(2).

As shown in FIG. 17(1), the correction filter Fb is situated perpendicularly to the incident beam (which is a parallel beam) incident on the reflecting surface r of the unit mirror $23_{in}$-b. In FIG. 17(2), the correction filter Fb, when viewed from the collimator filter 22, has a profile similar to the profile of the reflecting surface r as viewed from the collimator mirror 22 (i.e., an arc shape). In FIG. 17(2), the region of the correction filter Fb denoted by the symbol FEb corresponds to the dark region Eb on the reticle surface R. In FIG. 17(3), the cross-section of the correction filter Fb in the region FEb differs from the cross-section in other areas. Whereas regions other than the region FEb comprise a thick layer of Be, the region FEb comprises a thin layer of Be. The correction filter Fb can be manufactured by forming, on a Be substrate Fb1, a Be layer Fb2 only on regions other than the region FEb.

Figure 18:
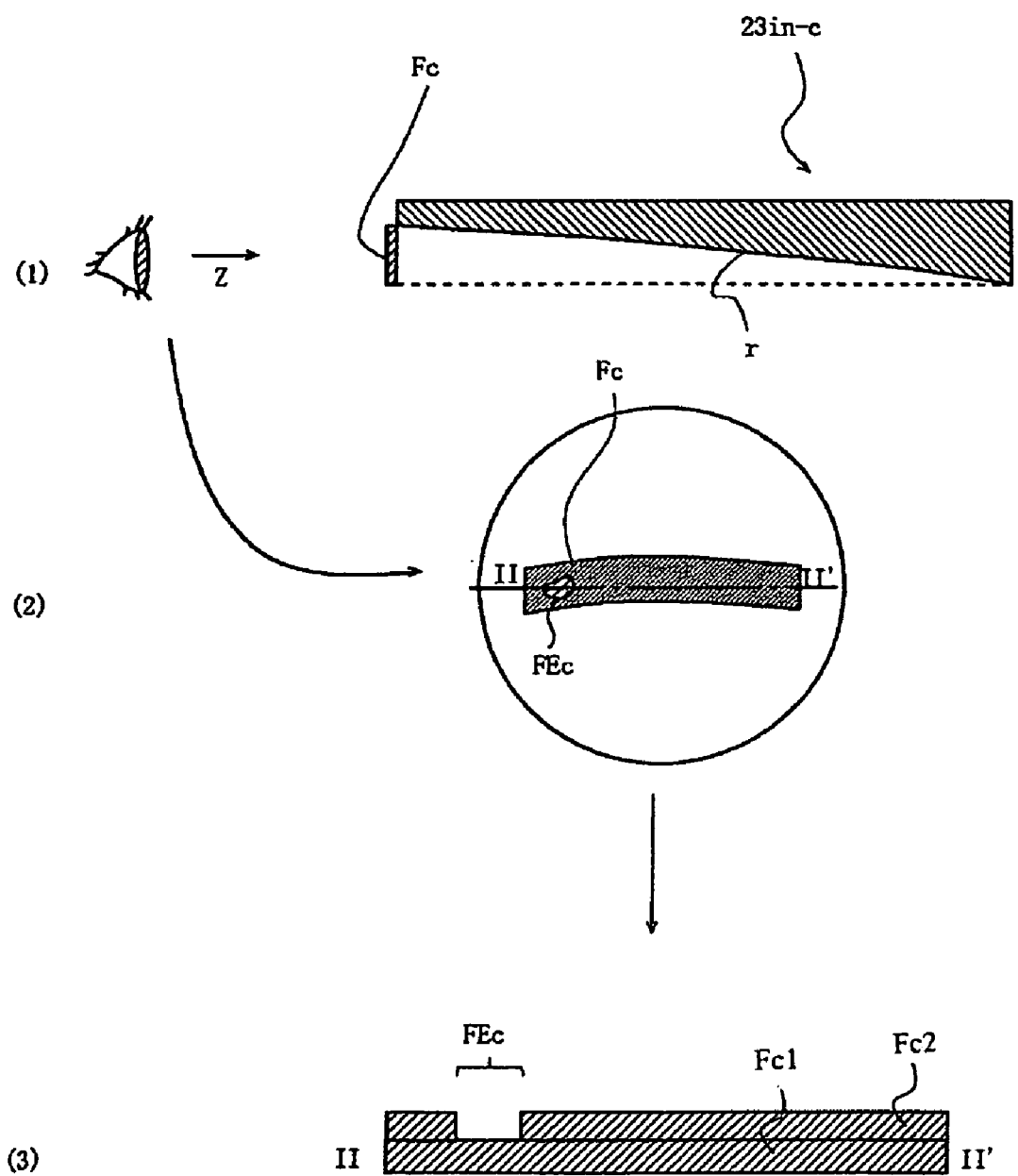
FIG. 18 depicts certain details of a correction filter Fc used in conjunction with a unit mirror $23_{in}$-c of the fly's-eye mirror 23.

The correction filter Fc is shown in FIG. 18, of which FIG. 18(1) shows the positional relationship between the unit mirror $23_{in}$-c and the correction filter Fc. FIG. 18(2) shows the correction filter Fc as viewed from the collimator mirror 22, and FIG. 18(3) schematically depicts a cross-section of the correction filter Fc along the line II-II' in FIG. 18(2).

As shown in FIG. 18(1), the correction filter Fc is inserted perpendicularly to the beam (which is a parallel beam) incident on the reflecting surface r of the unit mirror $23_{in}$-c. As shown in FIG. 18(2), the correction filter Fc has a profile, when viewed from the collimator filter 22, that is similar to the profile of the reflecting surface r as viewed from the collimator mirror 22 (i.e., an arc shape). In FIG. 18(2), the region of the correction filter Fc denoted by the symbol FEc corresponds to the dark region Ec on the reticle surface R. As shown in FIG. 18(3), the cross-section of the region Feb of the correction filter Fc differs from the cross-section in other regions of the correction filter. Also, whereas regions other than the region FEc comprise a thick layer of Be, the region FEc comprises only a thin layer of Be. The correction filter Fc can be manufactured by forming, on a Be substrate Fc1, a Be layer Fc2 on regions other than the region FEc.

In an illumination-optical system having the configuration described above, the transmissivity of the correction filter Fa in the region REa is low compared to the transmissivity in other regions of this filter. Similarly, the transmissivity of the correction filter Fb in the region REb is high compared to the transmissivity in other regions of this filter, and the transmissivity of the correction filter Fc in the region REc is high compared to the transmissivity in other regions of this filter.

Figure 8:
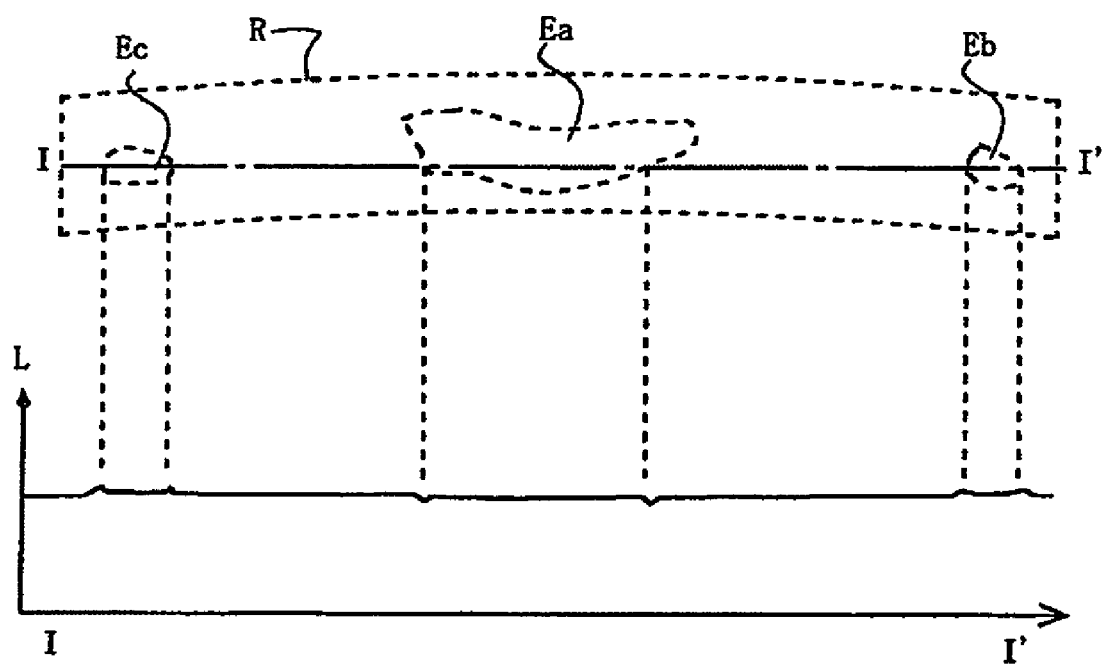
FIG. 8 depicts a distribution of illumination intensity at the surface of a reticle R after correction.

The number of correction filters Fa in the incidence face $23_{in}$ (see FIG. 13) of the fly's-eye mirror 23 is optimized according to the extent of brightness in the bright region Ea at the reticle surface R (see FIG. 2), measured in advance. The number of correction filters Fb in the incidence face $23_{in}$ (see FIG. 13) of the fly's-eye mirror 23 is optimized according to the extent of darkness in the dark region Eb at the reticle surface R (see FIG. 2), measured in advance, and the number of correction filters Fc in the incidence face $23_{in}$ (see FIG. 13) of the fly's-eye mirror 23 is optimized according to the extent of darkness in the dark region Ec at the reticle surface R (see FIG. 2), measured in advance. As a result, the illumination intensity at the reticle surface R is rendered uniform, for example as shown in FIG. 8.

Alternative Embodiment of Second Aspect

In the embodiment described above, the correction filters Fa, Fb, Fc of this aspect all have a two-layer structure made of Be. But, correction filters may also be used that alternatively have a Be single-layer structure that defines a respective aperture in the region in which the transmissivity is to be relatively increased (i.e., regions other than the region FEa in the correction filter Fa, the region FEb in the correction filter Fb, and the region FEc in the correction filter Fc).

In the embodiment described above, the correction filters Fa are used for correcting the bright region Ea at the reticle surface R. Alternatively, similar correction can be obtained by replacing a portion of the unit mirrors $23_{in}$-1, $23_{in}$-2, ... with correction mirrors 23a, 23a', as shown schematically in FIGS. 19(a) and 19(a'). The correction mirrors 23a, 23a' have reflecting surfaces that are unchanged from the reflecting surfaces of the unit mirrors $23_{in}$-1, $23_{in}$-2, ... before replacement. However, the correction mirror 23a comprises a $MoSi_2$ layer 23a2 that exhibits comparatively low reflectivity and a Mo or Ru layer 23a3 that exhibits comparatively high reflectivity. These layers are stacked on a substrate 23a1 (e.g., glass, ceramic, metal, or analogous material), with the Mo or Ru layer 23a3 being absent in the region 23Ea (i.e., the portion corresponding to the bright region Ea on the reticle surface R). Also, the correction mirror 23a' comprises a Mo or Ru layer 23a3, exhibiting comparatively high reflectivity, and a $MoSi_2$ layer 23a2, exhibiting comparatively low reflectivity, stacked on a substrate 23a1 (glass, ceramic, metal, or analogous material), with the $MoSi_2$ layer 23a2 being absent in regions other than the region 23Ea.

In the illumination-optical system of this aspect, the correction filters Fb are used for correcting the dark regions Eb at the reticle surface R. Alternatively, however, similar correction can be achieved by replacing respective portions of the unit mirrors $23_{in}$-1, $23_{in}$-2, . . . with correction mirrors 23b, 23b', as shown schematically in FIGS. 19(b) and 19(b'). The correction mirrors 23b, 23b' each have reflecting surfaces that are unchanged from the reflecting surfaces of the unit mirrors $23_{in}$-1, $23_{in}$-2, . . . before replacement. However, the correction mirror 23b comprises a $MoSi_2$ layer 23b2, exhibiting comparatively low reflectivity, and a Mo or Ru layer 23b3, exhibiting comparatively high reflectivity, stacked on a substrate 23b1 (glass, ceramic, metal, or analogous material), with the Mo or Ru layer 23b3 being absent in regions other than the region 23Eb (i.e., the region corresponding to the dark region Eb on the reticle surface R). The correction mirror 23b' comprises a Mo or Ru layer 23b3, exhibiting comparatively high reflectivity, and a $MoSi_2$ layer 23b2, exhibiting comparatively low reflectivity, stacked on a substrate 23b1 (glass, ceramic, metal, or analogous material), with the $MoSi_2$ layer 23b2 being absent in the region 23Eb.

In the illumination-optical system of this aspect, the correction filters Fc are used for correcting the dark regions Ec at the reticle surface R. Alternatively, however, similar correction can be achieved by replacing respective portions of the unit mirrors $23_{in}$-1, $23_{in}$-2, . . . with correction mirrors 23c, 23c', as shown schematically in FIGS. 19(c) and 19(c').

The correction mirrors 23c, 23c' each have reflecting surfaces that are unchanged from the reflecting surfaces of the unit mirrors $23_{in}$-1, $23_{in}$-2, . . . before replacement. However, the correction mirror 23c comprises a $MoSi_2$ layer 23c2, exhibiting comparatively low reflectivity, and a Mo or Ru layer 23c3, exhibiting comparatively high reflectivity, stacked on a substrate 23c1 (glass, ceramic, metal, or analogous material), with the Mo or Ru layer 23c3 being absent in regions other than the region 23Ec (i.e., the region corresponding to the dark region Ec on the reticle surface R). The correction mirror 23c' comprises a Mo or Ru layer 23c3, exhibiting comparatively high reflectivity, and a $MoSi_2$ layer 23c2, exhibiting comparatively low reflectivity, stacked on a substrate 23c1 (glass, ceramic, metal, or analogous material), with the $MoSi_2$ layer 23c2 being absent in the region 23Ec.

In this aspect, the various methods described in the alternative embodiment of the first aspect (i.e., providing tapered edges to the uppermost layer of the reflecting surfaces of correction filters or correction mirrors, and employing multiple types of correction filters or correction mirrors) may be used to render the illumination intensity more uniform.

In this aspect, correction filters Fa, Fb, Fc or correction mirrors 23a, 23b, 23c are used for correcting the bright region Ea, the dark region Eb, and the dark region Ec, respectively. Alternatively, a correction filter or correction mirror can be used for simultaneously correcting two or more of the aforementioned regions (e.g., the dark region Eb and the dark region Ec).

In an illumination-optical system of this aspect the unit mirrors $23_{in}$-1, $23_{in}$-2, . . . of the incidence face $23_{in}$ of the fly's-eye mirror 23 are equivalent to each other. Consequently, unit mirrors covered by the filters Fa, Fb, Fc, or unit mirrors replaced by the correction mirrors 23a, 23b, 23c may in principle be any of the unit mirrors. However, whenever it is possible to change the shape of an aperture diaphragm or other illumination condition, it is desirable that optimal unit mirrors be selected so as to enable continuation of the task of correcting illumination irregularities, regardless of changes in the illumination conditions.

In this aspect, unit mirrors covered by the filters Fa, Fb, Fc can be any of the unit mirrors $23_{in}$-1, $23_{in}$-2, . . . of the incidence face $23_{in}$ of the fly's-eye mirror 23. Alternatively, the mirrors can also be any of the unit mirrors $23_{out}$-1, $23_{out}$-2, . . . of the emission face $23_{out}$. Alternatively, the unit mirrors desirably can be the unit mirrors $23_{in}$-1, $23_{in}$-2, . . . of the incidence face $23_{in}$. This is because the incidence sides of the unit mirrors $23_{in}$-1, $23_{in}$-2, . . . are conjugate to the reticle surface R. Consequently, the region FEa of the correction filter Fa has a profile that is similar to the profile of the bright region Ea on the reticle surface R. Also, the region FEb of the correction filter Fb has a profile that is similar to the profile of the dark region Eb on the reticle surface R, and the region FEc of the correction filter Fc has a profile that is similar to the profile of the dark region Ec on the reticle surface R.

In this aspect, the unit mirrors replaced by correction mirrors 23a, 23b, 23c can be any of the unit mirrors $23_{in}$-1, $23_{in}$-2, . . . of the incidence face $23_{in}$ of the fly's-eye mirror 23. Alternatively or in addition, the replaced unit mirrors can be any of the unit mirrors $23_{out}$-1, $23_{out}$-2, . . . of the emission face $23_{out}$. However, it is desirable that the replaced unit mirrors be the unit mirrors $23_{in}$-1, $23_{in}$-2, . . . of the incidence face $23_{in}$. This is because the unit mirrors $23_{in}$-1, $23_{in}$-2, . . . are substantially conjugate with the reticle surface R. As a result, the region 23Ea of the correction mirror 23a has a profile that is substantially similar to the profile of the bright region Ea on the reticle surface R, the region 23Eb of the correction mirror 23b has a profile that is substantially similar to the profile of the dark region Eb on the reticle surface R, and the region 23Ec of the correction mirror 23c has a profile that is substantially similar to the profile of the dark region Ec on the reticle surface R.

Reduction of illumination irregularities by correction filters can also be applied to the illumination-optical system shown in FIG. 1. In this case, correction filters are placed in the vicinity of the incidence face $13_{in}$ of the fly's-eye mirror 13 so as to cover prescribed unit mirrors. That is, a portion of each of the unit mirrors $13_{in}$-1, $13_{in}$-2, . . . of the incidence face $13_{in}$ of the fly's-eye mirror 13 is covered by any of the correction filters Fa, Fb, Fc, shown in FIG. 16(3), FIG. 17(3), and FIG. 18(3).

In another embodiment in which illumination irregularities are reduced, portions of the unit mirrors (denoted by the symbols $13_{in}$-1, $13_{in}$-2, . . . in FIG. 1 and by the symbols $23_{in}$-1, $23_{in}$-2, . . . in FIG. 11) of the fly's-eye mirror are replaced by respective correction mirrors to which a "viscous substance," as described below, has been applied. More specifically, in this alternative embodiment, the correction mirrors are unit mirrors to the surfaces of which is applied clay, grease, or other viscous substance (which can be a substance in which Pt or Au is included as an additive). The viscous substance is selected so as not to outgas in a vacuum and to exhibit low reflectivity to EUV light. The viscous substance is caused to adhere to the unit mirrors by, e.g., chemical treatment.

By application of such a viscous substance to the surfaces of unit mirrors, one or more reflectivity irregularities can be formed that relatively reduce the illumination intensity of a bright region Ea at the reticle surface R. Alternatively or in addition, reflectivity irregularities can be formed on the unit mirrors that relatively increase the illumination intensity of dark regions Eb, Ec at the reticle surface R.

In this aspect, the shape of the unit mirrors of the fly's-eye mirror used with oblique incidence was configured as a portion of a paraboloid surface. Alternatively, any other shape can be used if similar optical performance can be obtained. For example, a Wolter-type mirror (e.g., any of types I, II, or III), a cylindrical mirror, a toroidal mirror, or other suitable mirror alternatively may be used.

Representative Embodiment of Third Aspect

Figure 20:
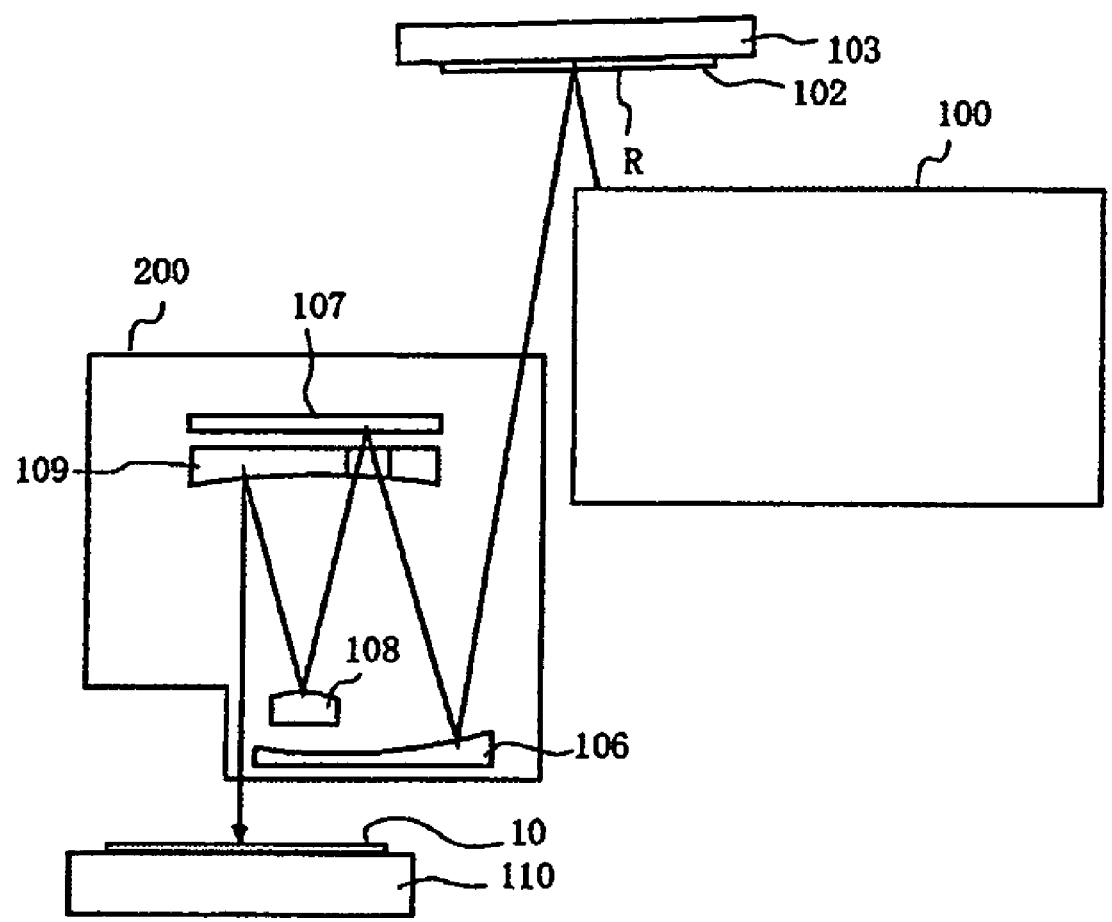
FIG. 20 is an optical diagram of the configuration of a projection-exposure system according to a third aspect of the invention.

A third aspect of the invention is depicted in FIG. 20, and pertains to a projection-exposure system. The subject projection-exposure system is a "reduction" (demagnifying) projection-exposure system that uses EUV light (e.g., EUV light having a wavelength of 50 nm or less) as the exposure beam, and employs a step-and-scan protocol for performing scanning exposure. The projection-exposure system comprises a projection-optical system 200 and an illumination-optical system 100. The illumination-optical system 100 can be, for example, as described in either of the first and second aspects described above. The illumination-optical system 100 illuminates the surface R (reticle surface) of a reticle 102 placed in the object plane of the projection-optical system 200.

The projection-optical system 200 projects, in effectively the perpendicular direction, the principal ray of the beam reflected from the reticle surface R. The beam is projected onto a wafer 10 placed on the image side of the projection-optical system 200. The projection-optical system 200 is non-telecentric at the object plane and telecentric at the image plane. The projection-optical system 200 is a reflective system (exhibiting a projection magnification of 1/4, 1/5, 1/6, or other suitable demagnification ratio) that comprises multiple reflecting mirrors (e.g., from two to eight; four are shown in the embodiment of FIG. 20) 106, 107, 108, 109. The projection-exposure system also comprises a reticle stage 103 that holds the reticle 102, and a wafer stage 110 that holds the wafer 10.

In a projection-exposure system having the foregoing configuration, the illumination-optical system 100 illuminates the reticle surface R with more uniformity than conventional systems, as do the embodiments of the first and second aspects. Hence, even if the projection-optical system 200 has the same configuration as a conventional projection-optical system, exposure irregularities are reduced.

Supplement to First, Second, and Third Aspects

In the first, second, and third aspects described above, the reticle surface R in the projection-exposure system was regarded as the area illuminated by the illumination-optical system. Also, the overall distribution of reflectivity exhibited by all the correction mirrors and the overall distribution of transmissivity exhibited by all the correction filters were established so as to correct illumination irregularities at the reticle surface R. The corrections were made by establishing characteristics (in the correction mirrors and filters) that were opposite the corresponding illumination irregularities. By correcting illumination irregularities at the reticle surface R in this manner, accompanying exposure irregularities in the projection-exposure system were reduced. However, the subject exposure irregularities that were reduced were the exposure irregularities arising only in the illumination-optical system; the possibility of illumination irregularities arising in portions of the projection-exposure system other than the illumination-optical system (e.g., arising in the projection-optical system) remains.

In view of the above, each of the above aspects may be modified as follows. The exposure area of the projection-exposure system is regarded as the area illuminated by the illumination-optical system. The overall distribution of reflectivity of all the correction mirrors and the overall distribution of transmissivity of all the correction filters are established so as to correct exposure irregularities of the projection-exposure system. These corrections are made by establishing characteristics in the correction mirrors and filters that are opposite the respective exposure-irregularity characteristics. That is, illumination irregularities are intentionally caused at the reticle surface R, and by this means exposure irregularities arising from locations other than the illumination-optical system, together with exposure irregularities arising from the illumination-optical system, are suppressed.

Representative Embodiment of Fourth Aspect

An embodiment of the fourth aspect of the invention is illustrated in FIGS. 21-27. This aspect is directed to the illumination-optical system. The depicted embodiment of the illumination-optical system according to this aspect shares many similarities with the embodiment of the illumination-optical system discussed above in connection with the first aspect (i.e., a direct-incidence type of reflective illumination-optical system; see FIG. 1). But, there are some differences, and substantially only the differences (from the embodiment of the first aspect) are described below.

A key difference is the fact that, in the instant embodiment, the exposure area of the projection-optical system is regarded as the illumination area in which exposure irregularities are corrected. In this embodiment, the corrections address exposure irregularities due to the s-polarized component as well as the p-polarized component of light incident on the exposure area.

The subject exposure irregularities are as follows. In a projection-exposure system in which the illumination-optical system is set before any corrections are made, the distribution of exposure intensity Ia in the exposure area can become non-uniform, as indicated for example by the solid line in FIG. 21, due to any of various causes such as a cause arising later in the illumination-optical system. The horizontal axis X in FIG. 21 indicates the position in a prescribed direction in the exposure area (e.g., the length direction of the exposure area), and the vertical axis I indicates the exposure intensity. The symbol Is denotes the exposure intensity due to the s-polarized component, the symbol Ip denotes the exposure intensity due to the p-polarized component, and the symbol Ia is the average exposure intensity of Is and Ip. Irregularities are present in the average exposure intensity Ia. For example, a concave-shaped irregularity occurs in the exposure intensity Is due to the s-polarized component, and another concave-shaped irregularity occurs in the exposure intensity Ip due to the p-polarized component. Also, a difference in intensity appears between the exposure intensity Is and the exposure intensity Ip.

The illumination-optical system of this aspect is of the same type as in FIG. 1 (i.e., a direct-incidence type of reflective illumination-optical system), in which three correction filters Fs, Fp, Fd are placed in series, as shown in FIG. 22(a), in the optical path on the incidence side of the incidence face $13_{in}$ of the fly's-eye mirror 13. The placement locations of these correction filters Fs, Fp, Fd are substantially conjugate (or nearly conjugate, see below) with the reticle surface R and the wafer surface in the projection-exposure system. However, for purposes of alignment of the correction filters Fs, Fp, Fd, to improve the convenience with which these filters can be replaced, and to avoid interference with rays incident on and reflected from unit mirrors, the placement positions are "defocused" by prescribed amounts from the respective conjugate positions. By placing the correction filters at these defocused positions, adverse effects due to deposition of dust or other extraneous matter on the correction filters Fs, Fp, Fd can be alleviated.

Figure 21:
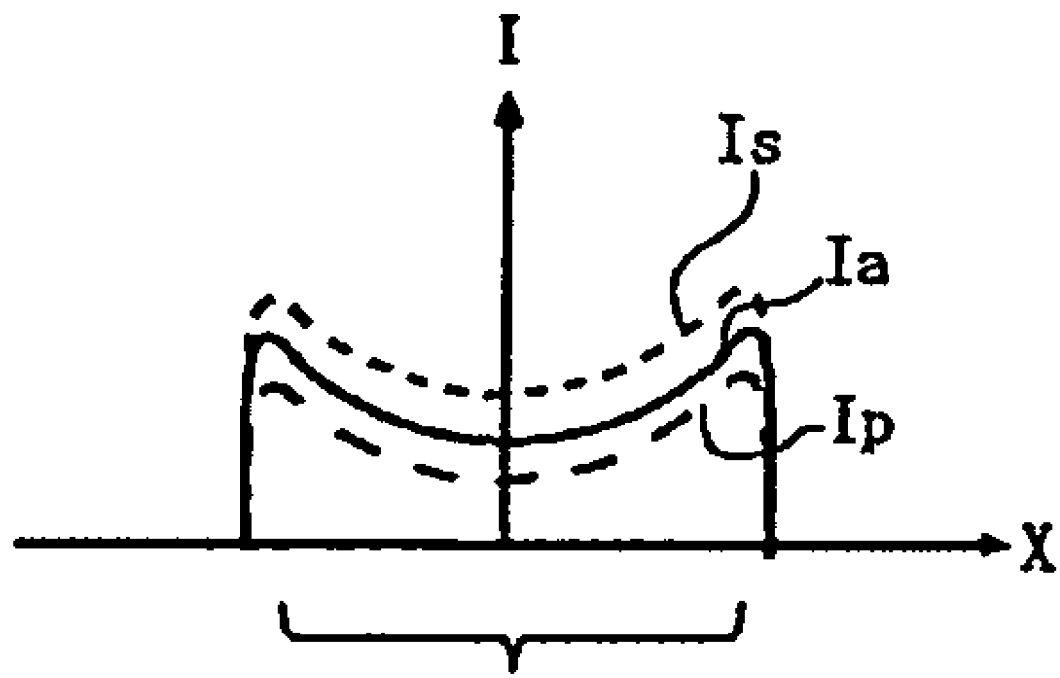
FIG. 21 schematically depicts exposure irregularities of a projection-exposure system according to a fourth aspect of the invention.
Figure 22:
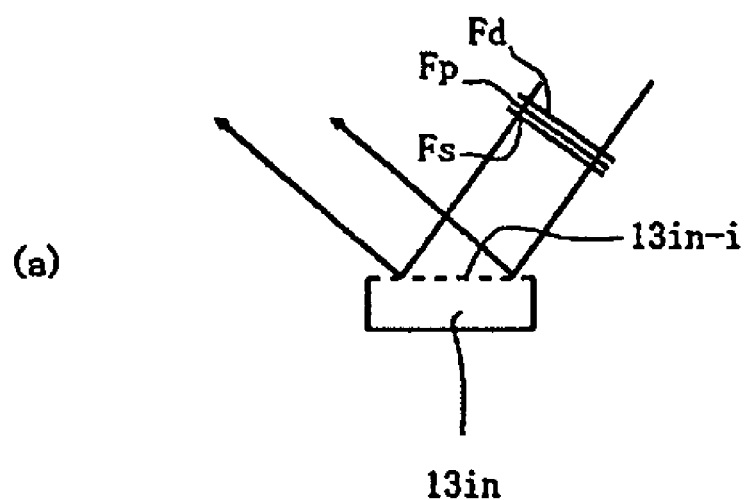
FIG. 22 depicts certain details of three correction filters Fs, Fp, Fd placed in series in the optical path on the incidence side of the incidence face $13_{in}$ of a fly's-eye mirror 13 used in an illumination-optical system according to the fourth aspect.
Figure 22:
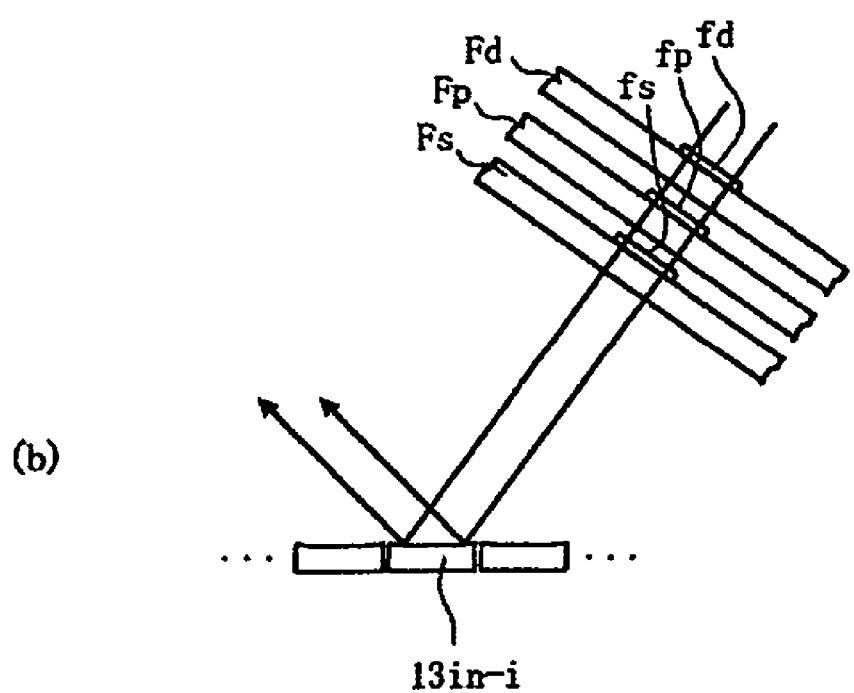
Figure 23:
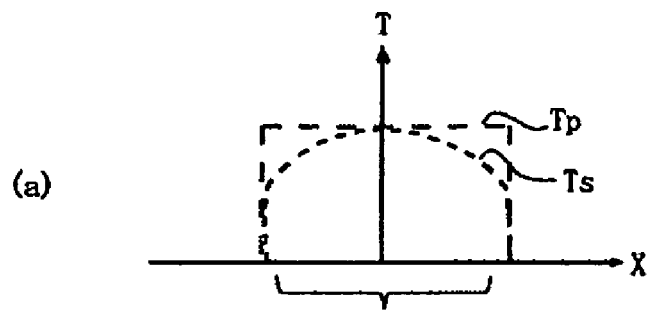
FIG. 23 depicts respective transmissivity distributions of the filter portions fs, fp, fd of the correction filters Fs, Fp, Fd, respectively.
Figure 23:
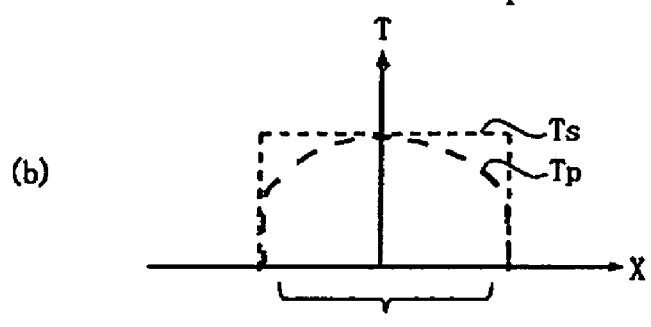
Figure 23:
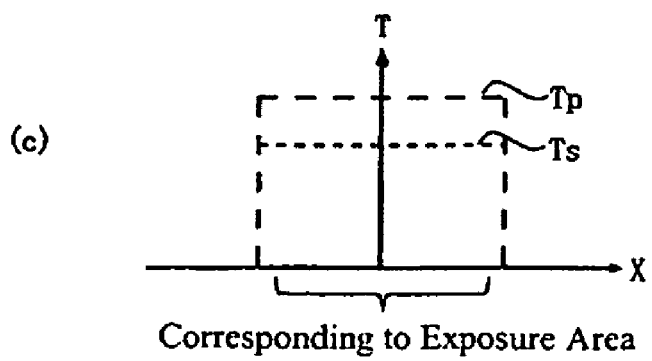
Figure 24:
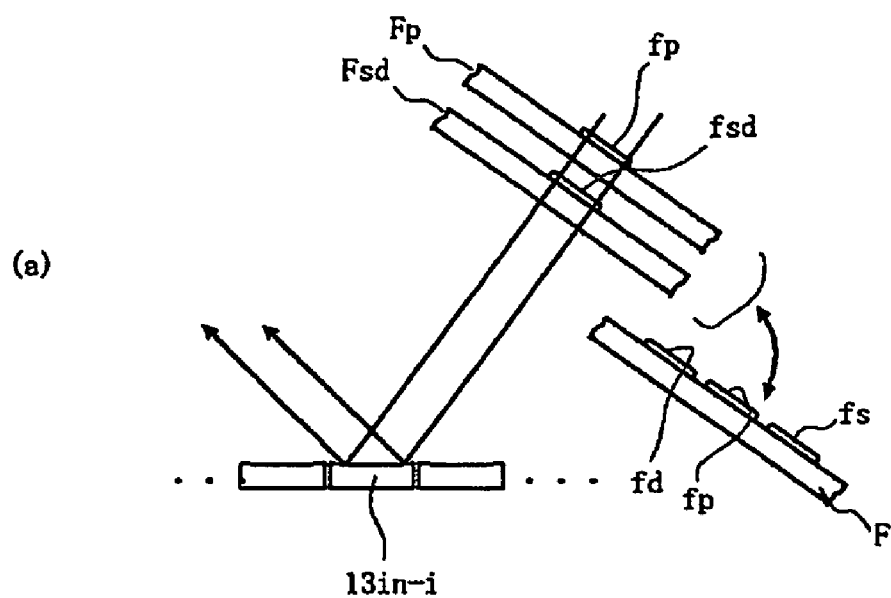
FIG. 24 depicts a modified configuration of correction filters Fp, Fs, Fd placed in the optical path on the incidence side of the incidence face of a fly's eye mirror used in an illumination-optical system according to the fourth aspect.
Figure 24:
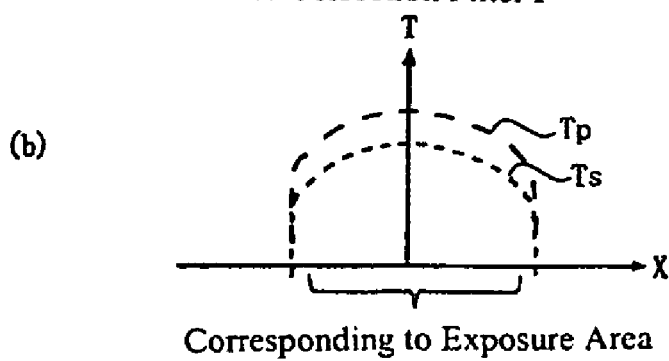

For simplicity of description, in this aspect the non-uniformity of the optical-intensity distribution shown in FIG. 21 is assumed to be caused by light incident on one mirror element $13_{in}$ on the incidence side of the fly's-eye mirror 13. FIG.

22(a) depicts correction of the illumination irregularities caused by light incident on this single mirror element $13_{in}$. An enlarged view of FIG. 22(a) appears in FIG. 22(b), in which the correction filters Fs, Fp, Fd include respective filter portions fs, fp, fd inserted into the incident optical path of the unit mirror $13_{in}$-i of the incidence face $13_{in}$. (In the figure the unit mirror $13_{in}$-i is assumed to be a single unit mirror.) Each filter portion is formed on a Be or other suitable substrate exhibiting high transmissivity to EUV light.

Each of the correction filters Fs, Fp, Fd, including regions thereof in which the filter portions fs, fp, fd are formed, desirably are extremely thin so that the respective transmissivities thereof are nearly 100%. Alternatively, the correction filters Fs, Fp, Fd are made as small as possible and are affixed to respective wire-mesh supports (fine wires made, e.g., of Be or other suitable material exhibiting high transmissivity to EUV light), not shown, to avoid as much as possible any unwanted losses of light flux. Each of the filter portions fs, fp, fd comprises a respective multilayer film to control transmissivity.

The filter portion fs of the correction filter Fs has a transmissivity distribution that is convex-shaped with respect to the s-polarized component of light. Thus, the filter portion fs corrects illumination irregularities (optical-intensity irregularities) occurring due to the s-polarized component of light. The filter portion fp of the correction filter Fp has a transmissivity distribution that is convex-shaped with respect to the p-polarized component of light. Thus, the filter portion fp corrects illumination irregularities (optical-intensity irregularities) occurring due to the p-polarized component of light. The filter portion fd of the correction filter Fd has a transmissivity distribution that is constant and that is lower, for example, by a prescribed amount for the s-polarized component of light than for the p-polarized component of light, so as to correct the intensity difference between the s-polarized component and the p-polarized component. The filter portion fd of the correction filter Fd allows differences between the maximum intensities, or differences between the average intensities, of the s-polarized and p-polarized components of the incident beam to be reduced.

The filter portion fs of the correction filter Fs acts as a simple transparent member or as a member exhibiting uniform transmissivity with respect to the p-polarized component. The filter portion fs has either substantially 100% transmissivity or a prescribed constant distribution of transmissivity. Similarly, the filter portion fp of the correction filter Fp acts as a simple transparent member or as a member having a uniform transmissivity with respect to the s-polarized component. The filter portion fp has either substantially 100% transmissivity or a prescribed constant distribution of transmissivity.

The respective transmissivity distributions of the filter portions fs, fp, fd are shown in FIGS. 23(a)-23(c), in which the horizontal axis X is the position, in the direction corresponding to the X-direction, of the exposure area, and the vertical axis T is transmissivity. The symbol Ts denotes the transmissivity of the s-polarized component, and the symbol Tp denotes the transmissivity of the p-polarized component.

In FIG. 23(a) the transmissivity distribution Ts for the s-polarized component of the filter portion fs is a convex-shaped curve. Thus, the distribution Ts offsets and suppresses the concave-shaped irregularity (see FIG. 21) in the exposure intensity Is of the s-polarized component, and thus produces a uniform distribution. In FIG. 23(b) the transmissivity distribution Tp for the p-polarized component of the filter portion fp is a convex-shaped curve. Thus, the distribution Tp offsets and suppresses the concave-shaped irregularity (see FIG. 21) in the exposure intensity Ip of the p-polarized component, and thus produces a uniform distribution. In FIG. 23(c), the transmissivity distribution Ts for the s-polarized component of the filter portion fd describes a curve that eliminates the difference between the exposure intensity Is and the exposure intensity Ip, with the ratio of exposure intensities (Is/Ip) (see FIG. 21) being made equal to 1. In FIG. 23(c) the curve is approximated by a straight line for simplicity.

To impart a desired transmissivity distribution to the filter portions fs, fp, fd, methods may be used in which the configuration of unit-layer groups in the multilayer film, the number of repetitions of unit-layer groups, the two-dimensional or three-dimensional positioning of unit-layer groups, and/or other parameters are optimized at different locations in the filter portions fs, fp, fd. In addition, the thickness or thickness distribution of the substrate on which the multilayer film is formed may be included in the list of parameters that can be optimized.

In the above aspect, irregularities in exposure intensity Is due to the s-polarized component and irregularities in exposure intensity Ip due to the p-polarized component are each corrected by the respective action of the filter portions fs and fp. Hence, even if optical members are used that exert different actions on the s- and p-polarized components at some locations in the projection-exposure system (reflective members, refractive members comprising special materials, or the like), exposure irregularities in the projection-exposure system are reliably suppressed.

Through the action of the filter portion fd, the difference between the exposure intensity Is and the exposure intensity Ip is suppressed, so that high exposure precision of the projection-exposure system is maintained, regardless of the reticle pattern. Specifically, the difference in resolving power for pattern lines extending vertically versus pattern lines extending horizontally is minimized.

In this embodiment three correction filters Fs, Fp, Fd are placed on the light-source side of one incidence-side mirror-element group $13_{in}$ of the fly's-eye mirror 13. Alternatively, the filters can be placed in the vicinity of the reticle surface (exposure surface), in a position that is substantially conjugate with (or nearly conjugate with) the reticle surface (exposure surface). In any event, the three correction filters Fs, Fp, Fd desirably have the optical characteristics shown in FIG. 23.

Alternative Embodiment of the Fourth Aspect

In the preceding embodiment a material that lowers the transmissivity for the s-polarized component was employed in the filter portion fd because the exposure intensity Is for the s-polarized component was higher than the exposure intensity Ip for the p-polarized component (see FIG. 21). When the exposure intensity Ip is higher than the exposure intensity Is, a material that lowers the transmissivity for the p-polarized component is used in the filter portion fd, in which case the distribution of the transmissivity Tp for the filter portion fd is a curve that results in the exposure-intensity ratio (Ip/Is) being unity (see FIG. 21).

For simplicity, in this embodiment similar concave shapes were assumed for the irregular distributions of exposure intensity Is for the s-polarized component and for the irregular distribution of the exposure intensity Ip for the p-polarized component. Alternatively, especially in cases in which the two distributions are different, the transmissivity Ts distribution characteristic for the filter portion fs and the transmissivity Tp distribution characteristic for the filter portion fp can each be set appropriately and independently to achieve reliable suppression of exposure irregularities.

In this embodiment the filter portions fs, fp, fd were placed in series in the same optical path. Alternatively, any two of the filter portions fs, fp, fd may be placed in different optical paths (parallel placement).

In this embodiment the filter portions fs, fp, fd were provided in different correction filters Fs, Fp, Fd. Alternatively, two or all these filter portions may be provided on a single correction filter that provides these filter portions in parallel in the optical path. Further alternatively, a filter portion can have an integrated configuration so as to have the combined functions of two or three of the filter portions fs, fp, fd. FIG. 24(a) shows an example of a correction filter Fsd comprising a single integrated filter portion fsd having the same functions as two filter portions fs and fd. The correction filter Fsd is used, in this figure, together with a correction filter Fp comprising the filter portion fp. Alternatively, as shown in this figure, a single integrated correction filter F can be used that comprises all the filter portions fs, fp, fd arranged in parallel in the optical path.

In any of the foregoing cases, it is sufficient that the distribution of transmissivity Ts and the distribution of transmissivity Tp for the correction filters be characterized as shown in FIG. 24(b).

In this embodiment the three filter portions (fs, fp, fd) are placed individually in series with each other. As a beam passes through the three filter portions fs, fp, fd, because the combined thickness of all three filter portions is relatively large, a concern is posed by the fact that, before the illumination irregularities are corrected, excessive light may be absorbed by the multilayer films. As a result, light from unit mirrors that should have been corrected by the three filter portions fs, fp, fd may be lost, or the light may be so weak that the purpose of correction may not be served. In such a case, the three correction filters fs, fp, fd can be placed such that they act on separate unit mirrors.

According to the principle for producing an irregularity-free illumination using a fly's-eye mirror as a reflective-type optical integrator, even if there are slight differences in the optical characteristics or optical performance (caused by, e.g., differences in reflectivity of mirrors, differences in transmissivity of lenses, or analogous problems) of each unit mirror of the fly's-eye mirror, rays from a plurality of unit mirrors arrive at the reticle with constant intensity as an effect of averaging. Averaging is due to the superpositioning of the rays at the irradiated surface (or at a plane conjugate to the irradiated surface) after passing through a condenser optical system.

Whenever irregularities exist within the irradiated plane (exposed area) due to the respective distributions of illumination intensity (or illumination distributions) for s-polarized and p-polarized light, or whenever there are differences in the maximum intensities or average intensities between s- and p-polarized light, by placing unit mirrors having characteristics that cancel these irregularities in the fly's-eye mirror, it is possible in principle to realize target illumination-intensity values (specifically, a situation in which there are no irregularities due to s-polarization, no irregularities due to p-polarization, and no differences in the maximum intensities or average intensities of s-and p-polarized light).

In FIG. 1, rays incident on the fly's-eye mirror are in the form of a parallel beam, and the unit mirrors used are all the same. Hence, even if the action of the three filter portions fs, fp, fd is compromised, and other unit mirrors are caused to act as such filter portions, in principle the results can be combined to produce the same effect.

However, due to reflectivity irregularities in the collimator mirror used for forming the parallel beam, there are situations in which the same result cannot be obtained even when the unit mirrors are all the same and the angles of the incident rays are equal. In such cases, either a plurality of any of the filter portions fs, fp, fd can be used to perform correction, according to the various illumination irregularities that cannot be completely corrected by one filter portion, or a plurality of any of new filter portions fs', fp', fd' (each having a correcting power that is less than the correcting power of the corresponding filter portion fs, fp, fd) can be used to correct irregularities due to s-polarization, irregularities due to p-polarization, and intensity differences between the s-polarized component and the p-polarized component, respectively. Furthermore, any of various combinations of the three filter portions fs, fp, fd and the three new filter portions fs', fp', fd', or a plurality of any of the three filter portions fs, fp, fd with a plurality of any of the three new filter portions fs', fp', fd' can be used. By means of such adjustment methods, adequate correction is possible even for very small differences from ideal exposure conditions.

The three filter portions fs, fp, fd and the three new filter portions fs', fp', fd' can be provided on a Tran missive substrate placed in the optical path on the light-source side of the fly's-eye mirror or can be provided on a plurality of transparent substrates placed in parallel with each other. The filter portions can also be formed on the various unit mirrors (mirror elements) of the fly's-eye mirror.

FIG. 25(a) shows a single correction filter Fp, on which are provided two filter portions fp-i, fp-j arranged in parallel in the optical path. The filter portions fp-i, fp-j have prescribed transmissivities for p-polarized light to correct irregularities in the p-polarized component. In this case, the filter portions fp-i, fp-j function differently to control the transmissivity.

Figure 25:
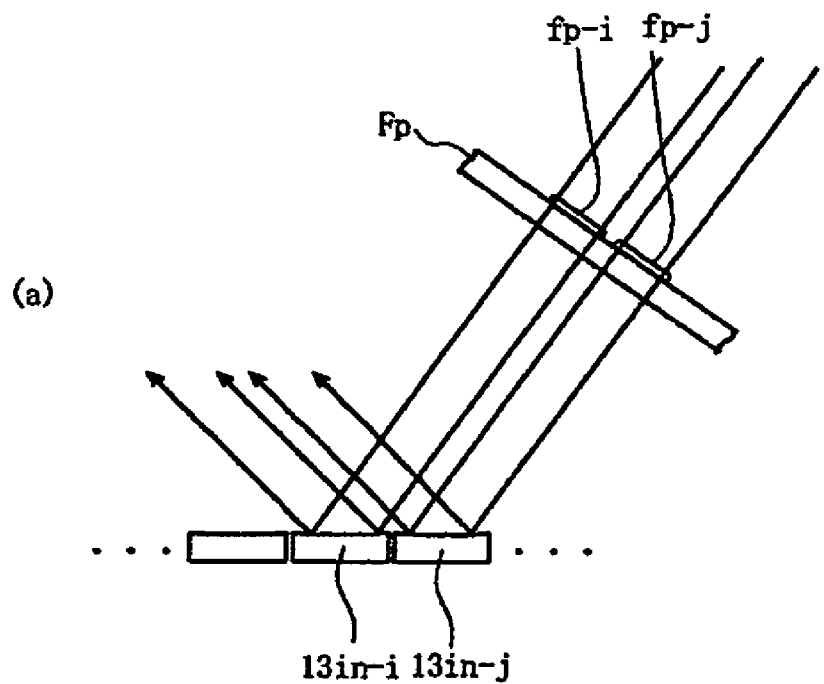
FIG. 25 depicts a further modification of the illumination-optical system of the fourth aspect, wherein in FIG. 25(a) the number of filter portions is changed, and in FIG. 25(b) the orientation of the filter F is changed.
Figure 25:
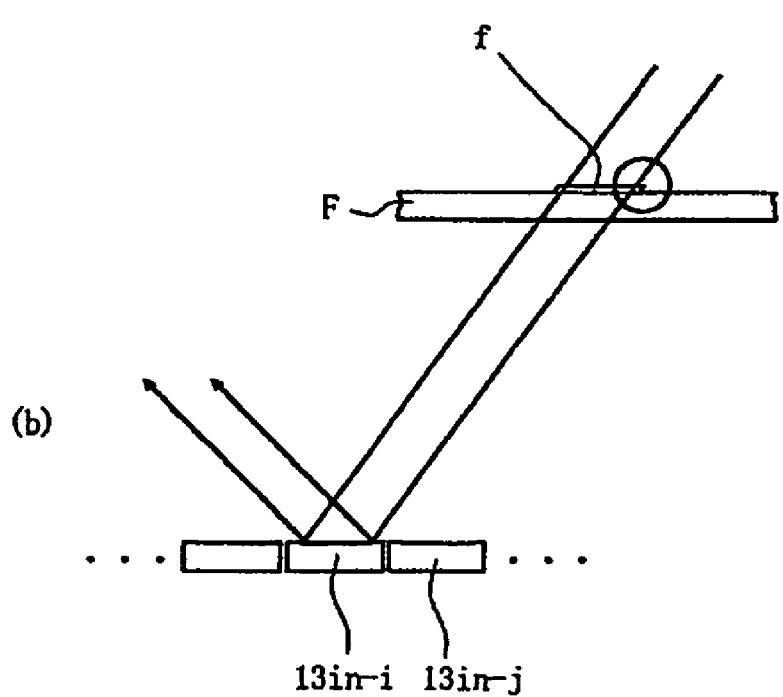

In the example shown in FIG. 25, a plurality of filter portions used for correcting irregularities in the s-polarized component and a plurality of filter portions used for correcting differences in the respective intensities of the s- and p-polarized components are configured as separate members. Alternatively, portions (corresponding to mirror elements $13_{in}$) of individual filter portions can be combined as one member or two members.

The correction filters Fs, Fp, Fd shown in FIG. 22(b) and elsewhere are placed perpendicularly with respect to the incident rays at the incident face $13_{in}$. Alternatively, as shown in FIG. 25(b), the correction filters can be placed parallel to the plane of the substrate on which are placed unit-mirror groups, rather than perpendicularly to the incident rays. This parallel placement allows the filters to be aligned easily. Also, whenever a plurality of correction filters is used, the action of the filters on each of the incident rays can be imparted uniformly more easily.

Figure 26:
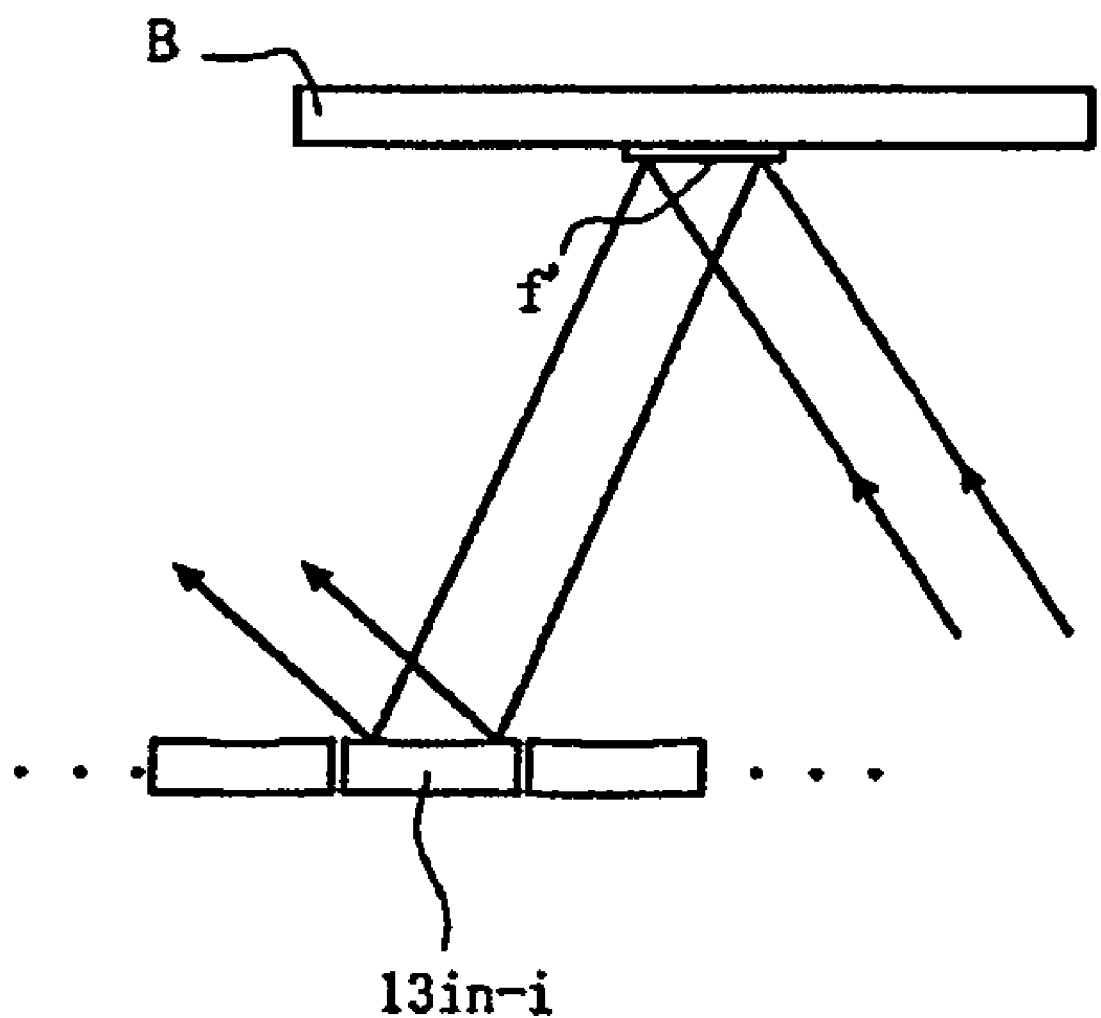
FIG. 26 depicts a further modification of the illumination-optical system of the fourth aspect, wherein a correction plate B is used instead of a correction filter F.

In this embodiment correction filters to control the transmissivity of the incident beam (see FIG. 22(b) and similar) were used. Alternatively, a reflection-type correction plate B can be used that controls the reflectivity of the incident beam. As shown in FIG. 26, a reflection-type correction plate B has a correction portion f' on a reflective substrate. The distribution of reflectivity exhibited by the correction portion f' is substantially the same as the distribution of transmissivity of the filter portion f. However, whenever a reflection-type correction plate B is used, the optical path of the illumination-optical system must be bent at least once.

Figure 27:
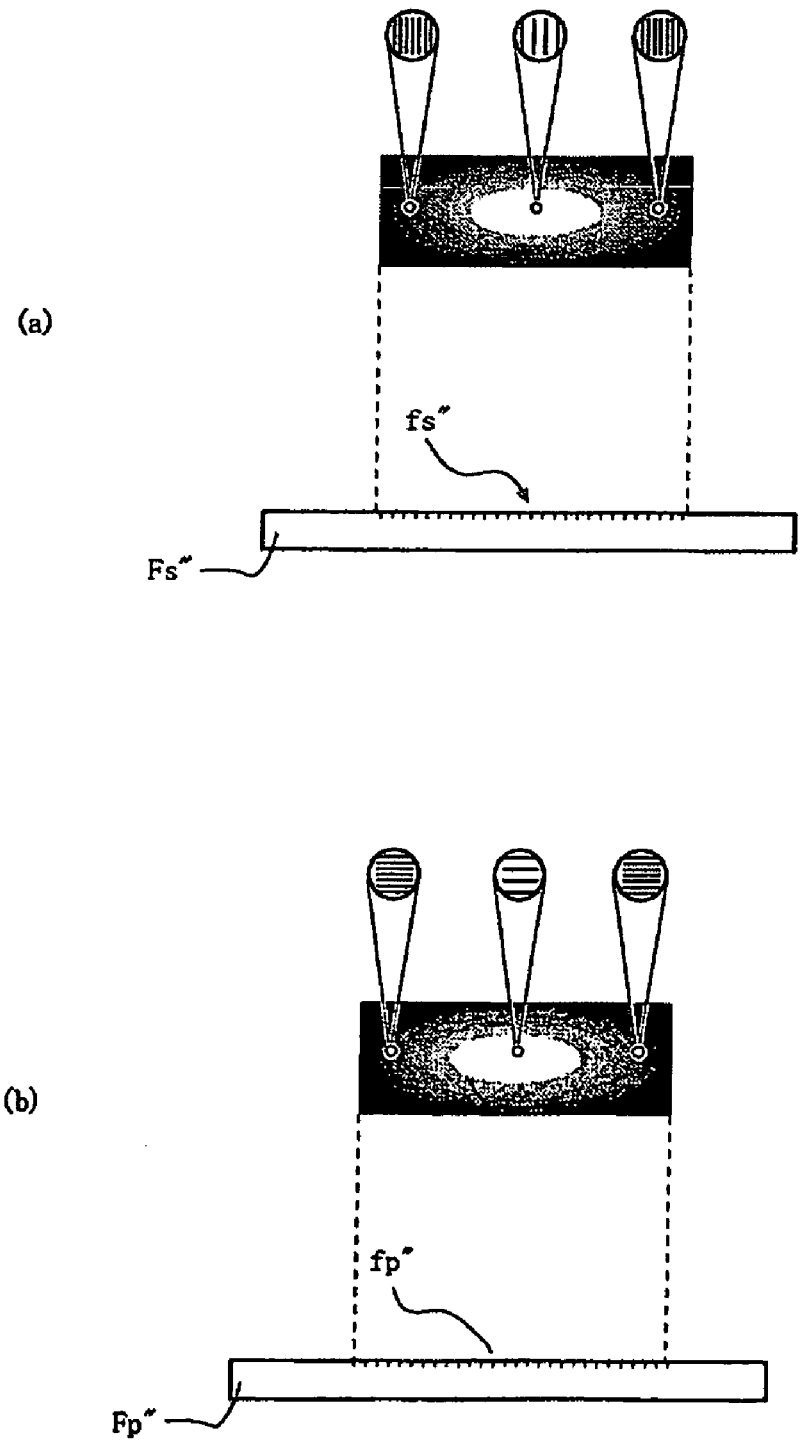
FIG. 27 depicts a further modification of the illumination-optical system of the fourth aspect, wherein correction filters Fs" and Fp" comprising rule-line patterns fs", fp" are used.

In this embodiment the filter portions fs, fp (or the filter portion fd) comprising multilayer films on a transparent substrate are used as the correction filters Fs, Fp (or correction filter Fd), respectively (see, e.g., FIG. 22(b)). Alternatively, as shown in FIGS. 27(*a*) and 28(*b*), correction filters Fs", Fp" each comprising mesh-shaped scratches (scribe patterns) fs", fp" on a transparent substrate may be used. The bottom portions of FIGS. 27(*a*) and 28(*b*) show respective cross-sections of the correction filters Fs" and Fp". In the center portion of each figure, overall front views of the scribe patterns fs" and fp" (when the two-dimensional transmissivity distribution is convex) are shown. In the top portion of each figure, partial enlarged views of the scribe patterns fs", fp" are schematically shown.

The direction of the scribe pattern fs" of the filter portion Fs" is in a direction that reduces the light flux of the s-polarized component of the incident beam. The placement-density-distribution characteristic of the scribe pattern fs" is the opposite of the distribution of transmissivity Ts of the filter portion fs. This is because the higher the placement density of the scribe pattern fs", the lower the transmissivity Ts. On the other hand, the direction of the scribe pattern fp" of the correction filter Fp" is in a direction that reduces the light flux of the p-polarized component of the incident beam. The placement-density-distribution characteristic of the scribe pattern fp" is the opposite of the distribution of transmissivity Tp of the filter portion fp. This is because the higher the placement density of the scribe pattern fp", the lower the transmissivity Tp.

In place of the correction filters Fs" and Fp", wire groups on which are formed patterns similar to those of the scribe patterns fs", fp" may be used.

The illumination-optical system of this aspect is a modification of the illumination-optical system of the first aspect (i.e., a direct-incidence-type reflective illumination-optical system). Alternatively, the illumination-optical system of this aspect can be of the same type as in the second aspect (i.e., an oblique-incidence-type reflective illumination-optical system).

In this aspect the difference between the exposure intensity Is and the exposure intensity Ip was reduced. But, whenever a scan method is employed as the exposure method in the projection-exposure system, or in other cases in which a prescribed difference is to be provided between the exposure intensity Is and the exposure intensity Ip, the characteristics of each of the filter portions (i.e., filter portions fs, fp, fd, or the like) are established such that irregularities in the exposure intensity Ip and irregularities in the exposure intensity Is are both corrected and the prescribed difference between the exposure intensity Ip and the exposure intensity Is is achieved.

Representative Embodiment of the Fifth Aspect

Figure 28:
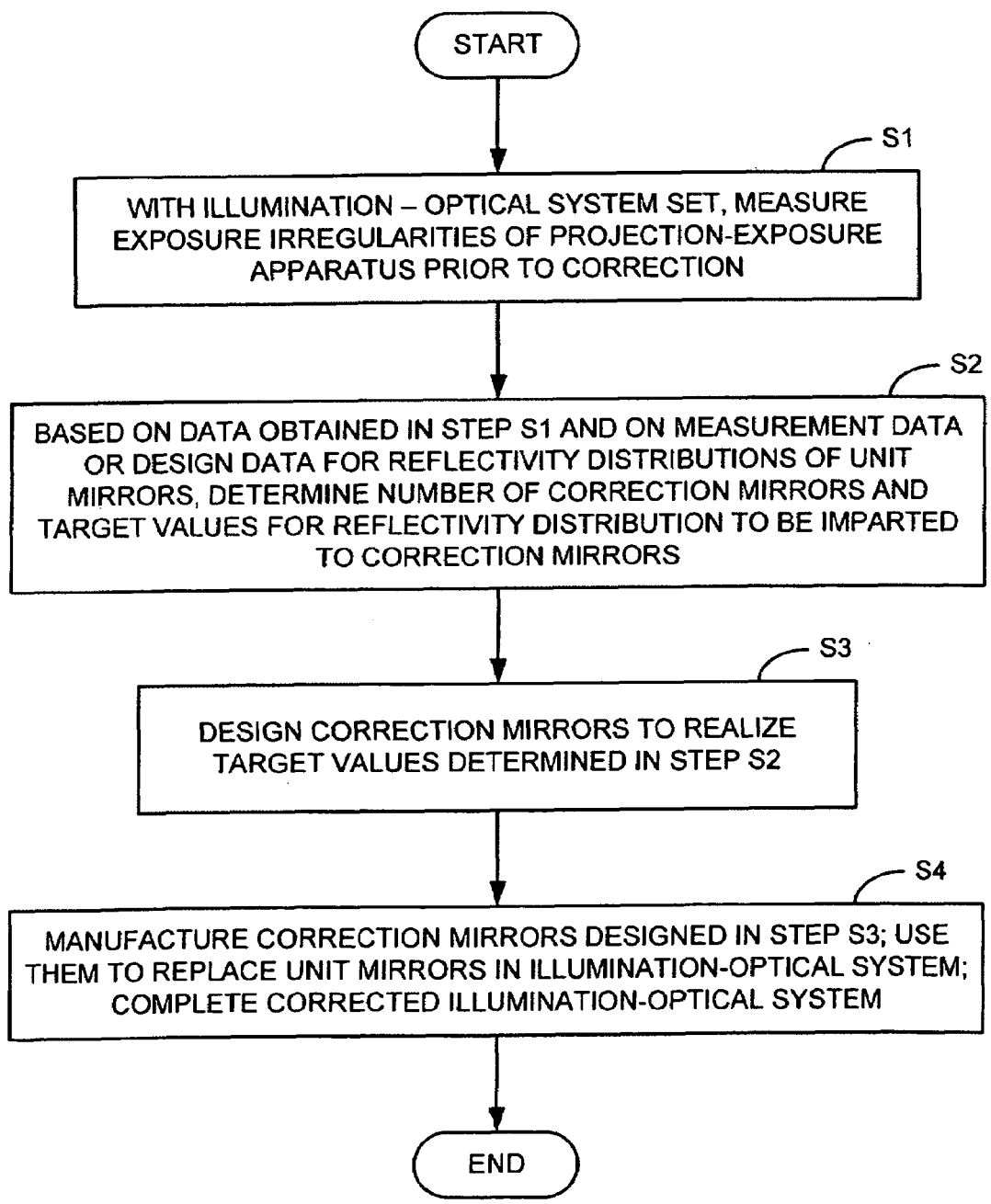
FIG. 28 is a flowchart of an embodiment of a method for manufacturing an illumination-optical system, according to a fifth aspect of the invention.
Figure 29:
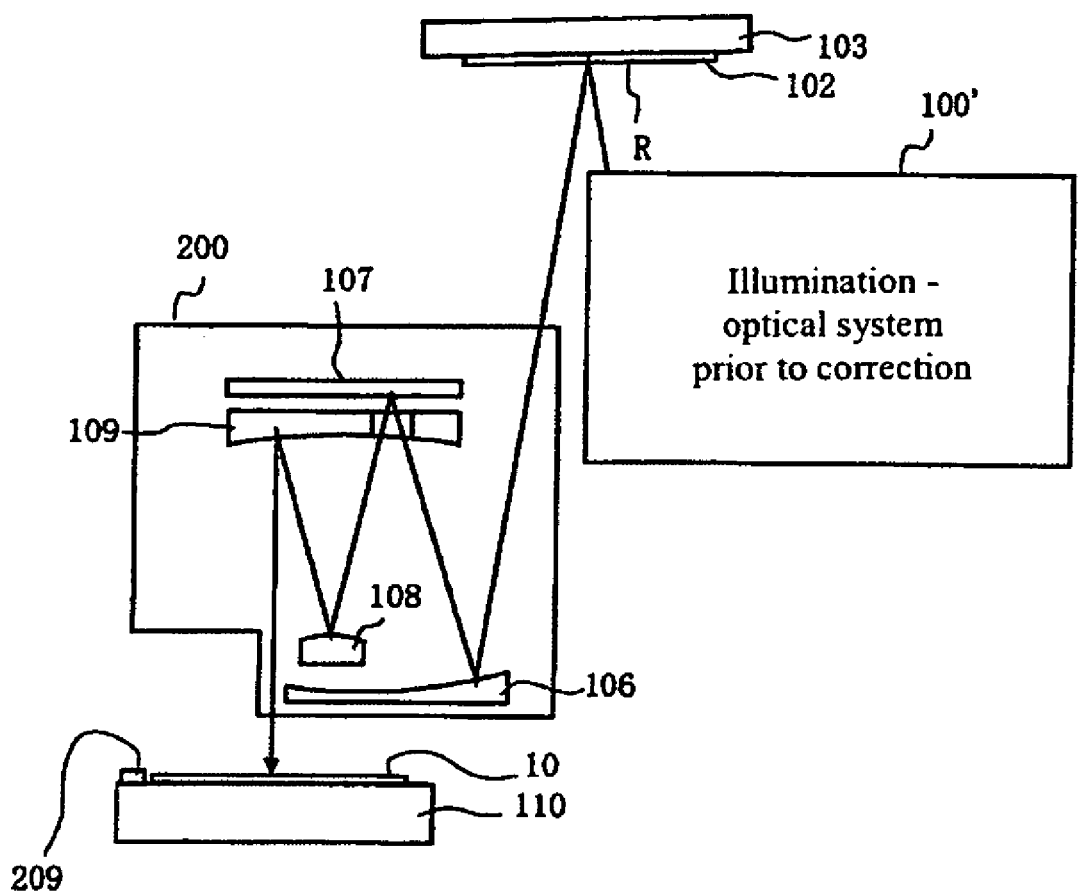
FIG. 29 is an optical diagram illustrating step S1 in FIG. 28.
Figure 30:
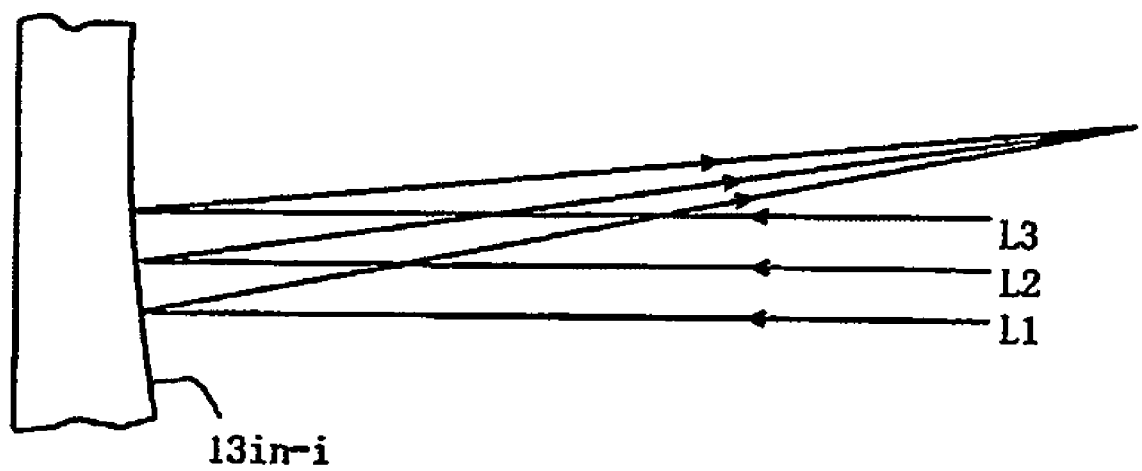
FIG. 30 depicts the relationship between the unit mirror $13_{in}$-i and incident light in the system of FIG. 29.

A fifth aspect of the invention is shown in FIGS. 28-30, which are directed to methods for manufacturing an illumination-optical system. The illumination-optical system manufactured according to this aspect is an illumination-optical system similar to that of the first aspect (i.e., a direct-incidence-type reflective illumination-optical system). By replacing any of the unit mirrors $13_{in}$-$i$ of the incidence face $13_{in}$ of the fly's-eye mirror 13 in the illumination-optical system with a correction mirror having the same reflecting-surface shape, exposure irregularities in the projection-exposure system are corrected.

A block diagram of the manufacturing method is shown in FIG. 28. In step S1 the illumination-optical system 100' (as indicated in FIG. 29), before being provided with correction mirrors, is mounted in the projection-exposure system. Exposure irregularities (i.e., the exposure-intensity distribution within the exposure area) are measured. These measurements are performed, for example, using a light-measurement sensor 209 provided on the wafer stage 110 (see FIG. 29). The exposure area is scanned in two dimensions by the light-measurement sensor 209 to obtain measurement data for the exposure irregularities. In step S2, target values for the reflectivity distribution to be imparted to the correction mirrors are determined based on the measurement data obtained by measurements performed in step S1. The determinations are also based on measurement data (or design data) for the reflectivity distributions of each of the unit mirrors $13_{in}$-$1$, $13_{in}$-$2$, ... of the fly's-eye mirror 13. At this time, the number of correction mirrors for replacement, the unit mirrors $13_{in}$-$i$ to be replaced, and other parameters are also determined. In step S3, multilayer films are configured for the correction mirrors to realize the reflectivity distributions closest to the target values. Specifically, the configuration of unit-layer groups of multilayer films to be formed on the reflecting surfaces of the correction mirrors (e.g., the materials, the thicknesses d of the layers, and other parameters), as well as the target value for the number N of repetitions of the unit-layer group, are optimized. A well-known method of multilayer-film design can be applied to this optimization. For the thicknesses d and number of layer repetitions N, different respective values are adopted for each position (each unit area) on the reflecting surface of the correction mirror. The reasons for this are as follows.

First, EUV light (a type of X-ray) is used as the light source 11 for the illumination-optical system. As explained in the first aspect, the multilayer film comprises a stack of unit-layer groups. (Each "unit-layer group" comprises a set of alternating layers, such a layer of Mo and a layer of Si, for example, or alternating layers of other suitable materials.) Reflection of EUV light from such a multilayer film is a result of constructive interference of light reflected at numerous interfaces formed by the many layers. Consequently, whenever the angle of incident light (here, EUV light) satisfies the Bragg reflection condition:

$$2d \sin\theta = n\lambda,$$

(where n is an arbitrary integer) for the particular thickness ("period length") of the unit-layer group and the wavelength $\lambda$ of the incident light, reflectivity is high. But, when this condition is not satisfied, almost no reflection occurs. The larger the number N of unit-layer groups, the higher the reflectivity with which incident light is reflected. But, the larger the number N of unit-layer groups, the narrower the full width at half maximum (FWHM) of the peak in the angular characteristic of the reflectivity.

In the portion of an illumination-optical system shown in FIG. 30, the incident light L1, L2, L3 is incident at different angles at the respective positions on the unit mirror $13_{in}$-$i$. For example, the angle of incidence of light L1 is 84.26°, the angle of incidence of light L2 is 85.70°, and the angle of incidence of light L3 is 87.13°. If the wavelength $\lambda$=13.5 nm and n=1, then the optimum thickness d differs as follows:

incident light L1: d=6.784 nm incident light L2: d=6.769 nm incident light L3: d=6.758 nm Thus, even when comparing only the thicknesses d, values clearly will differ with the angle of incident light, i.e., with position on the reflecting surface. The smaller the radius of curvature of the reflecting surface of the correction mirror, the more prominent the differences in the angles of incident light. As a result, during optimization, it is necessary to finely divide the unit areas. Also, the more complex the shape of the reflecting surface of the correction mirror, the more prominent the differences in the angles of incident light. As a result, during optimization, it is necessary to finely divide the unit areas (step S3 ends here).

In step S4 the correction mirrors provided with multilayer films designed in step S3 are manufactured. Also, a fly's-eye mirror incorporating the correction mirrors is installed in the illumination-optical system, thereby completing assembly of the illumination-optical system.

In the manufacturing method described above, target values for the reflectivity distribution to be imparted to the correction mirrors are determined based not only on measurement data for exposure irregularities, but also on data for the reflectivity distributions of the unit mirrors $13_{in}$-1, $13_{in}$-2, ... before replacement. Target values thus determined based on detailed information accurately indicate the reflectivity distributions required to correct exposure irregularities in the projection-exposure system. As a result, an illumination-optical system manufactured by the manufacturing method of this aspect achieves suppression of exposure irregularities of a projection-exposure system with high precision.

Alternative Embodiment of the Fifth Aspect

The illumination-optical system manufactured by the embodiment of a manufacturing method of this aspect, as described above, suppresses exposure irregularities specific to the projection-exposure system. However, an illumination-optical system manufactured according to the steps (1), (2), (3) below also can suppress changes in exposure irregularities during operation of the projection-exposure system:

(1) Prior to shipping the projection-exposure system, various exposure irregularities that can occur during operation of the projection-exposure system are predicted through simulations or actual measurements.

(2) Various fly's-eye mirrors for correcting the various exposure irregularities are manufactured using the procedures of steps S2 and S3 described above.

(3) An illumination-optical system is assembled incorporating the various manufactured fly's-eye mirrors in a manner that enables switching of same.

By means of such an illumination-optical system, a user can merely switch between various fly's-eye mirrors as appropriate, and so can suppress changes in exposure irregularities occurring with the passage of time during operation of the projection-exposure system, as well as illumination irregularities occurring sporadically during operation of the system.

The illumination-optical system of this aspect, as described above, is a reflection-type illumination-optical system similar to that used in the first aspect (i.e., a direct-incidence-type reflective illumination-optical system). Alternatively, the illumination-optical system may be an illumination-optical system of the same type used in the second aspect (i.e., an oblique-incidence type reflective-optical system).

Figure 19:
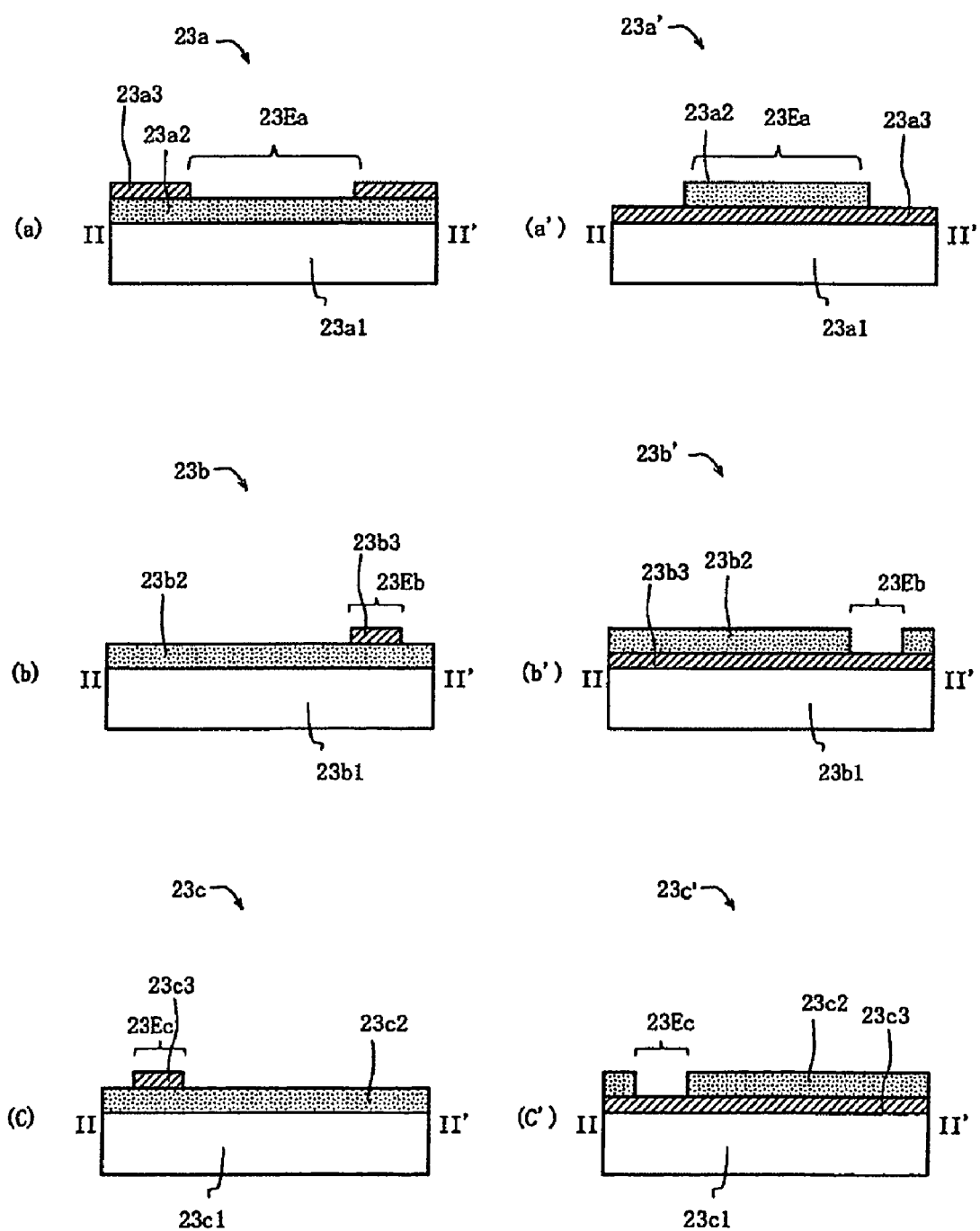
FIG. 19 depicts certain details of modified correction mirrors 23a1, 23b1, 23c1 used in a fly's-eye mirror in a system according to the second aspect.

In this case, what are formed on the reflecting surfaces of the correction mirrors are, for example and as described in the second aspect, $MoSi_2$ layers, and Mo or Ru or other layers having comparatively high reflectivity (see FIG. 19). Hence, step S3 involves the design of the structure of these layers.

In the descriptions of various aspects set forth above, polarized light was regarded as being p-polarized light and s-polarized light, linearly polarized in two orthogonal directions. However, light polarized in two orthogonal directions need not be linearly polarized. Rather, the light may be any combination of polarized light so long as the polarization is in two intersecting directions. Hence, the light polarized in two intersecting directions of this invention includes combinations of linearly polarized light that is polarized in two orthogonal or intersecting directions, combinations of elliptically polarized light having major axes (minor axes) in two directions that are orthogonal or intersecting, and combinations of circularly polarized light that are right- and left-circularly polarized.

By using methods for correcting illumination irregularities at the illuminated surface or by providing correction means in each of the above aspects, adjustment methods are provided for achieving satisfactory performance of illumination-optical systems, and methods are provided for manufacturing such systems.

Also, by using methods for correcting illumination irregularities at the reticle surface or at the surface of the photosensitive substrate, and by providing correction means in each of the above aspects, adjustment methods are provided for exposure systems, and methods are provided for manufacturing exposure systems that can produce satisfactory microdevices.

Representative Embodiment of Sixth Aspect

Figure 31:
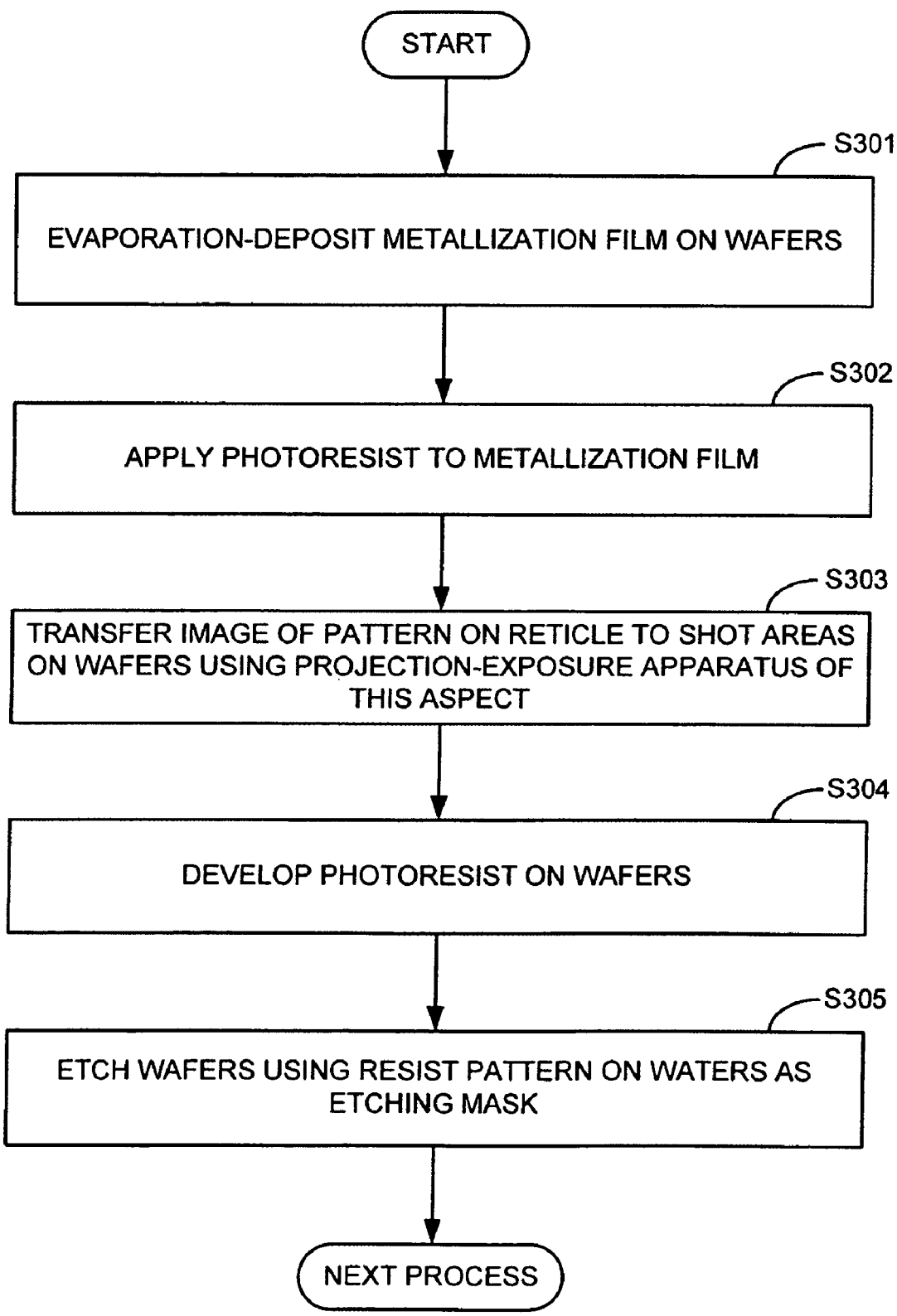
FIG. 31 is a flowchart of an embodiment of a method for manufacturing a microdevice, according to a sixth aspect of the invention.
Figure 32:
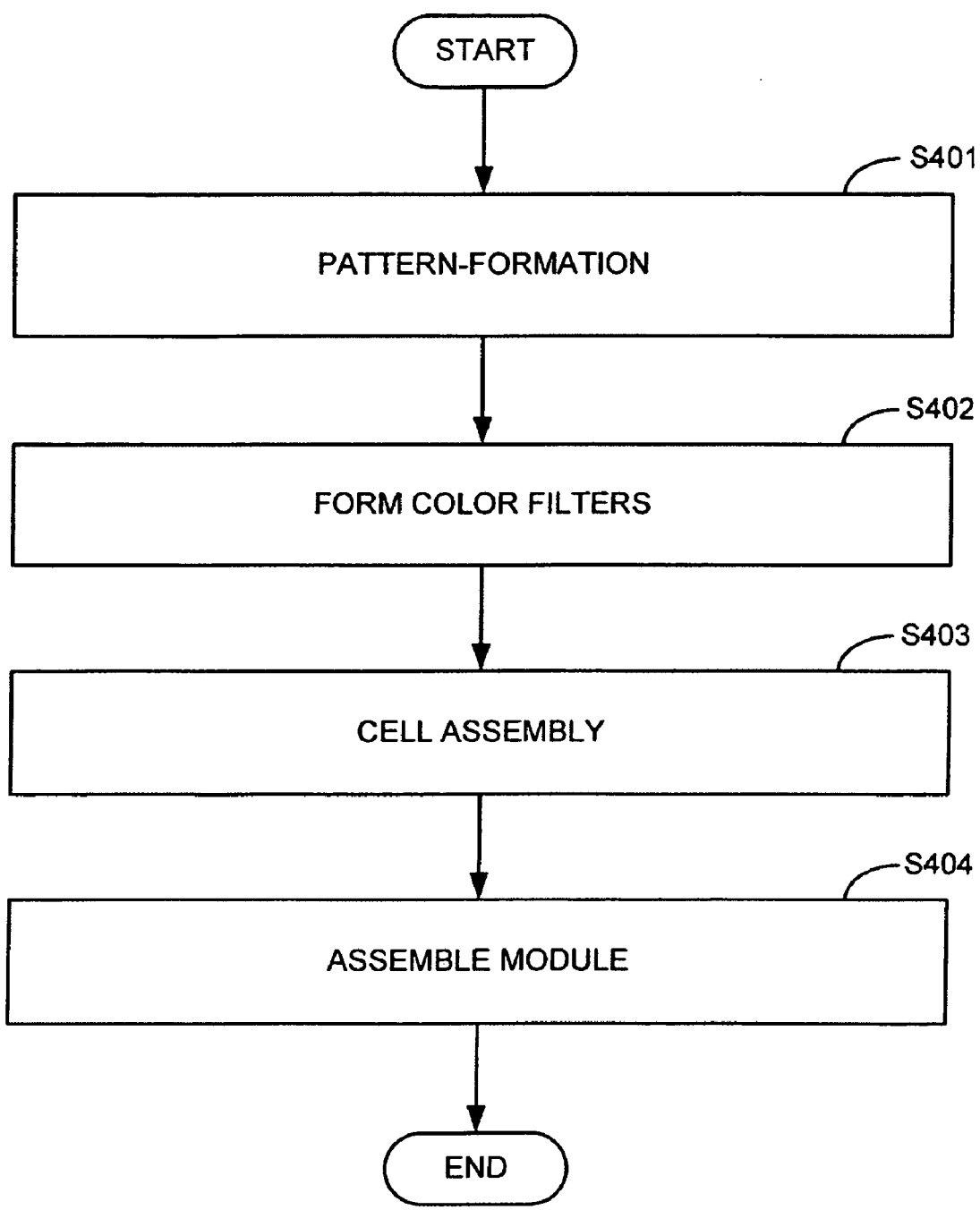
FIG. 32 is a flowchart of an embodiment of a method for manufacturing a liquid-crystal display element.

An embodiment of the sixth aspect of the invention is set forth in FIGS. 31 and 32. According to this aspect, a projection-exposure system of the fifth aspect (including an illumination-optical system) is used to illuminate a reticle (also termed a "mask") in an illumination step. The projection-exposure system is used to expose, in an exposure step and on a photosensitive substrate, a transfer pattern as defined on the reticle. By these means, microdevices (e.g., semiconductor devices, image-capture elements, liquid-crystal display elements, thin-film magnetic heads, and other devices) can be manufactured.

Described below is an exemplary process for producing semiconductor devices (as exemplary microdevices) by forming prescribed circuit patterns on a wafer or similar substrate (as the photosensitive substrate) using a projection-exposure system of the above-described aspect. Referring to the flow chart of FIG. 31, in step S301 a metallization film is evaporation-deposited on a lot of wafers. In step S302, a photoresist is applied to the metallized film on the lot of wafers. In step S303 a projection-exposure system, such as any of such systems described above, is used to perform exposure-transfer, via the projection-optical system, of an image of the pattern on the reticle to each of the shot areas on the lot of wafers. Thereafter, in step S304 the photoresist on the lot of wafers is developed, and in step S305 the resist pattern on the lot of wafers is used as an etching mask by which circuit patterns corresponding to the pattern on the mask are formed in each of the shot areas on the wafers. By subsequently forming circuit patterns on subsequent layers, semiconductor devices or other microdevices are manufactured. By means of this manufacturing method, semiconductor devices having extremely finely detailed circuit patterns are produced with good throughput.

Using a projection-optical system of the aspect described above, by forming a prescribed pattern (circuit pattern, electrode pattern, or the like) on a plate (glass or other suitable substrate), a liquid-crystal device, as an example microdevice, can be produced. An example of such a method is described below with reference to the flowchart in FIG. 32. In the pattern-formation step S401 in FIG. 32, the projection-exposure system of the above-described aspect is used to execute a so-called photolithographic process by which a mask pattern is transfer-exposed onto a photosensitive substrate (e.g., a glass or other suitable substrate onto which a layer of resist has been applied). In this photolithographic step, a prescribed pattern, containing numerous electrodes or other features, is formed on the photosensitive substrate. The exposed substrate is subjected to a development step, an etching step, a resist-removal step, and other steps as required to form the prescribed pattern on the substrate.

Processing then proceeds to the color-filter-formation step S402, in which numerous sets of three dots corresponding to R (Red), G (Green), and B (Blue) are arranged in a matrix (or, alternatively, three R, G, B stripes are arranged in numerous filter combinations in the horizontal scan direction), to form a color filter. After the color-filter-formation step S402, a cell-assembly step S403 is performed, in which the substrate (including a prescribed pattern obtained in the pattern-formation step S401, the color filters obtained in the color-filter-formation step S402, and other components) is subjected to steps by which liquid-crystal cells of the liquid-crystal panel are formed. For example, in the cell-assembly step S403, liquid crystals are injected between the substrate and the color filters to form the liquid-crystal cells of the panel. In the module-assembly step S404, electrical circuitry for causing display operation of the assembled liquid-crystal panel, a backlight, and other components are installed, to complete the liquid-crystal-display device. By means of this manufacturing method, liquid-crystal-display devices having extremely finely detailed circuit patterns can be produced with good throughput.

Supplements to Aspects

In the descriptions set forth above, beryllium (Be) is used as a material for making transmissive filters. However, use of this specific material is not required, and any material exhibiting high transmissivity to EUV light and that is appropriate for placement in a vacuum (i.e., does not outgas or exhibit any other undesirable behavior in the vacuum) may be used. For example, sufficiently thin copper (Cu) or other suitable material may be used.

The above-described "transparent" substrates are substrates that exhibit high transmissivity to EUV light. A transparent substrate can be, for example, a thin film of Be or other material exhibiting high transmissivity to EUV light. The thin film of Be or other material can be supported by, for example, placement on a wire mesh.

In the various aspects described above, reflective illumination-optical systems and reflective projection-optical systems were described. However, this invention also can be used with reflective-refractive-type illumination-optical systems and with reflective-refractive-type projection-optical systems.

In the various aspects described above, the illumination-optical systems were described as being used with projection-exposure systems. However, an illumination-optical system of this invention also may be applied to or used with any of various other optical equipment (e.g., a microscope or the like) requiring reduction of illumination irregularities in the visual field.

In the various aspects described above, examples were presented in which illumination irregularities and exposure irregularities occurring due to light polarized in two intersecting directions were corrected. Alternatively, illumination irregularities and exposure irregularities occurring due to light polarized in only one direction (among light polarized in two intersecting directions) may be corrected using the invention. Further alternatively, illumination irregularities and exposure irregularities arising from specific polarized light may be corrected.

In the aspects relating to correction of illumination irregularities or exposure irregularities occurring due to polarized light, optical systems configured mainly as reflective systems (illumination-optical systems and the like) were described. However, irregularity-correction means of this invention also can be advantageously employed in optical systems configured as refractive systems (illumination-optical systems and the like) and in optical systems configured as combinations of refractive systems and reflective systems (illumination-optical systems and the like).

Irregularity-correction methods and systems according to the foregoing aspects can be used in illumination-optical systems, illumination systems, projection-exposure systems, and other equipment used in manufacturing processes (manufacturing methods), as well as in processes using such apparatuses. Different aspects can be combined to correct specific irregularities.

Figure 33:
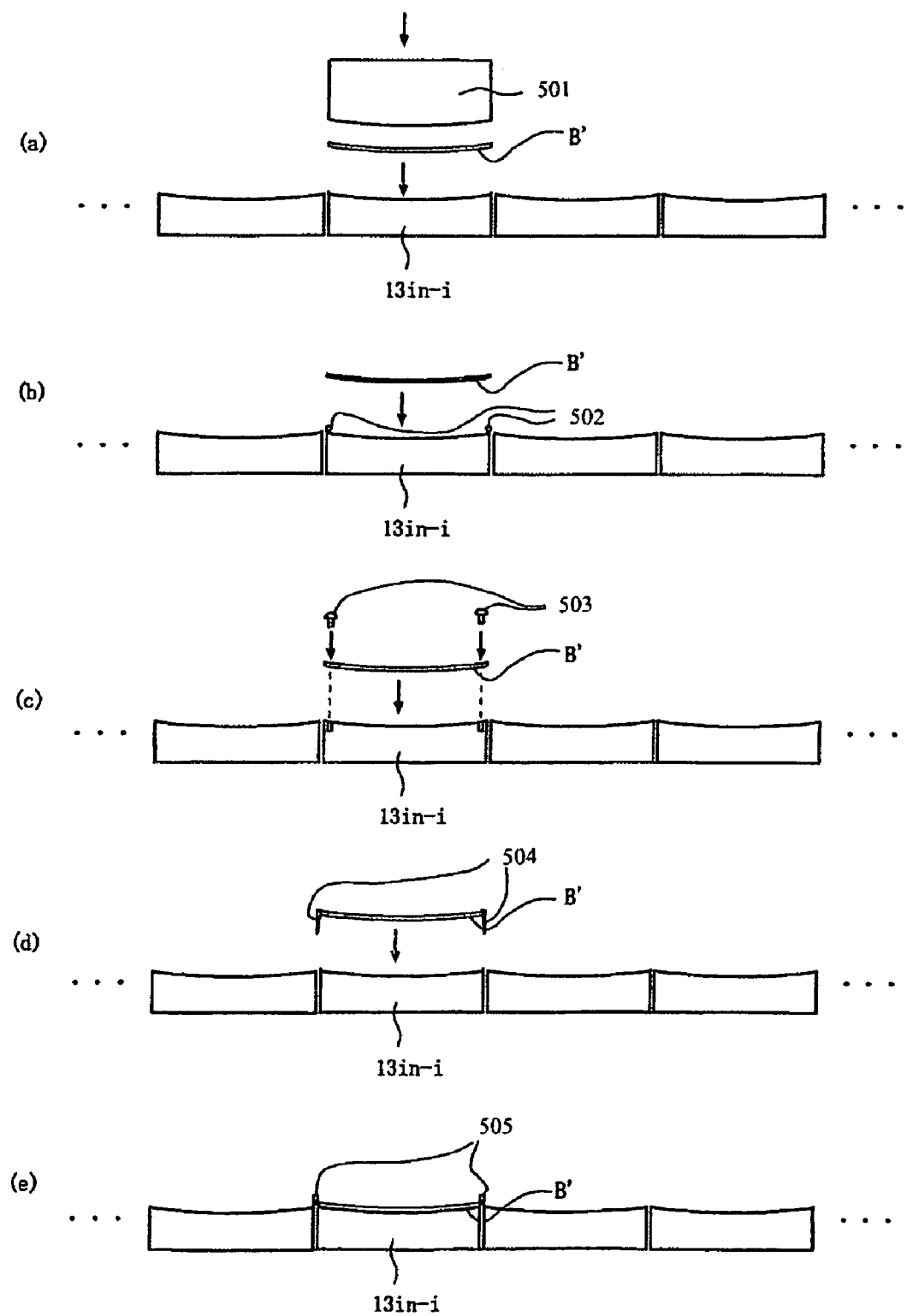
FIG. 33 depicts various exemplary ways in which a correction plate B' can be installed on the reflecting surface of a unit mirror $13_{in}$-i.

In illumination-optical systems according to the foregoing aspects, correction plates B' mounted directly on the reflecting surfaces of unit mirrors $13_{in}$-$i$ may be used as correction means for correcting illumination irregularities (or exposure irregularities). Correction plates B' can be produced by a method as shown for example in any of FIGS. 33(a)-33(e). The correction plate B' shown in FIG. 33(a) is pressure-bonded using a pressure-bonding jig 501 onto the reflecting surface. The correction plate B' shown in FIG. 33(b) is mounted onto the reflecting surface using silicon grease or other suitable adhesive 502 applied to an unused area on the periphery of the unit mirror $13_{in}$-$i$. The correction plate B' shown in FIG. 33(c) is mounted onto the reflecting surface by screws 503 affixing the plate in unused regions on the periphery of the unit mirror $13_{in}$-$i$. The correction plate B' shown in FIG. 33(d) is mounted onto the reflecting surface by clips (protruding portions) that mate with gaps between the unit mirror $13_{in}$-$i$ and adjacent mirrors. The correction plate B' shown in FIG. 33(e) is mounted onto the reflecting surface by a support 505 provided in an unused region on the periphery of the unit mirror $13_{in}$-$i$.

INDUSTRIAL APPLICATIONS

By means of this invention, illumination-optical systems are realized in which even slight illumination irregularities occurring after assembly of the optical system are alleviated.

By means of this invention, high-performance projection-optical systems are realized that produce minimal exposure irregularities.

By means of this invention, methods for manufacturing microdevices are provided that achieve the manufacture of high-performance microdevices.

By means of this invention, methods for manufacturing illumination systems are provided that achieve the manufacture of high-performance illumination systems exhibiting reduced illumination irregularities.

By means of this invention, methods for adjustment of projection-exposure systems are provided that achieve reductions in exposure irregularities exhibited by the projection-exposure systems.

By means of this invention, methods for manufacturing projection-exposure systems are provided that achieve the manufacture of high-performance projection-exposure systems exhibiting reduced exposure irregularities.

I claim:

1. An illumination-optical system, comprising:
   a light source that emits extreme ultraviolet (EUV) light;
   a collimator located downstream of the light source;
   a fly's-eye mirror located downstream of the collimator and comprising multiple unit mirrors; and
   a condenser located downstream of the fly's eye mirror and having an emission side;
   wherein the illumination-optical system Köhler-illuminates a prescribed illumination area on the emission side of the condenser, the illumination area including one or more uneven illumination distributions; and at least one of the unit mirrors of the fly's-eye mirror is a correction mirror having one or more reflectivity irregularity regions configured to correct at least a portion of the one or more uneven illumination distributions in the illumination area.

2. The illumination-optical system of claim 1, wherein:
the fly's eye mirror comprises a number of correction mirrors, the number being one or more; and
a ratio of the number of correction mirrors to the number of unit mirrors of the fly's eye mirror has a value that is according to an extent of the one or more uneven illumination distributions.

3. The illumination-optical system of claim 1, wherein:
each unit mirror and each correction mirror comprises a respective reflecting surface coated with a respective multilayer film to improve reflectivity of the reflecting surface to the EUV light; and
the multilayer film on each correction mirror has a respective distribution of number of layers across the reflecting surface, the distribution corresponding to the respective one or more reflectivity irregularity regions of the correction mirror.

4. The illumination-optical system of claim 1, wherein:
the unit mirrors and the at least one correction mirror have respective orientations at which EUV light from the light source is incident at respective oblique angles of incidence;
the angles of incidence are within a range of total-reflection angles; and
each correction mirror has a surface structure including at least one feature configured to have a distribution sufficient to define the respective one or more reflectivity irregularity regions.

5. The illumination-optical system according to claim 4, wherein:
the EUV light emitted by the light source has a wavelength of 50 nm or less; and
the multiple unit mirrors comprise Ru or Mo and are placed at respective orientations providing an oblique angle of incidence of 15° or less to incident EUV light.

6. The illumination-optical system of claim 1, wherein the correction mirror corrects at least one uneven illumination distribution arising from polarized light that, among polarized light polarized in two intersecting directions that is illuminating the illumination area, is polarized in at least one of the directions.

7. The illumination-optical system of claim 1, wherein:
the correction mirror has a first reflectivity-distribution characteristic and a second reflectivity-distribution characteristic;
the first reflectivity-distribution characteristic is for a first polarization component and is configured to correct at least one uneven illumination distribution arising from the first polarization component illuminating the illumination area; and
the second reflectivity-distribution characteristic is for a second polarization component, polarized in a direction intersecting a respective direction of the first polarization component illuminating the illumination area, and is configured to correct at least one uneven illumination distribution arising from the second polarization component illuminating the illumination area.

8. An illumination-optical system, comprising:
a light source that emits extreme ultraviolet (EUV) light;
a collimator located downstream of the light source;
a fly's-eye mirror located downstream of the collimator and comprising multiple unit mirrors each having an incidence side; and
a condenser located downstream of the fly's-eye mirror and having an emission side;
wherein the illumination-optical system Köhler-illuminates a prescribed illumination area on the emission side of the condenser, the illumination area including one or more uneven illumination distributions; and
at least one of the unit mirrors of the fly's-eye mirror includes a respective correction filter situated on the incidence side of the unit mirror, the correction filter having one or more transmissivity irregularity regions configured to correct at least a portion of the one or more uneven illumination distributions in the illumination area.

9. The illumination-optical system of claim 8, wherein:
the fly's-eye mirror comprises a number of correction filters, the number being one or more; and
a ratio of the number of correction filters to the number of the unit mirrors of the fly's-eye mirror has a value that is according to an extent of the one or more uneven illumination distributions.

10. The illumination-optical system of claim 8, wherein the at least one correction filter has a respective thickness distribution sufficient to define at least one respective transmissivity irregularity region.

11. The illumination-optical system of claim 8, wherein:
the unit mirrors have respective orientations at which EUV light from the light source is incident at respective oblique angles of incidence; and
the angles of incidence are within a range of total-reflection angles.

12. The illumination-optical system of claim 11, wherein:
the EUV light emitted by the light source has a wavelength of 50 nm or less; and
the multiple unit mirrors comprise Ru or Mo and are placed at respective orientations providing an oblique angle of incidence of 15° or less to incident EUV light.

13. The illumination-optical system of claim 8, wherein the correction filter includes:
a first transmissivity distribution for a first polarization component, the first transmissivity distribution being configured to correct illumination irregularities due to the first polarization component illuminating the illumination area; and
a second transmissivity distribution for a second polarization component, polarized in a direction intersecting a respective direction of the first polarization component illuminating the illumination area, to correct at least one illumination irregularity region due to the second polarization component illuminating the illumination area.

14. The illumination-optical system of claim 13, wherein the correction filter includes:
a first filter member, having a first transmissivity distribution for a first polarization component, to correct illumination irregularities due to the first polarization component illuminating the illumination area; and
a second filter member, having a second transmissivity distribution for a second polarization component, polarized in a direction intersecting a respective direction of the first polarization component illuminating the illumination area, to correct illumination irregularities due to the second polarization component illuminating the illumination area.

15. A projection-exposure system, comprising:

a reticle stage configured to hold a reticle on a first surface;

a substrate stage configured to hold a photosensitive substrate on a second surface;

a projection-optical system situated and configured to project an image of the first surface onto the second surface; and an illumination-optical system as recited in claim 1, the illumination-optical system being configured to illuminate the first and the second surfaces simultaneously by illuminating the first surface, and being configured in advance to correct at least one illumination irregularity on the first surface or on the second surface serving as the illumination area.

16. A microdevice-manufacturing method, comprising a lithographic step performed using the projection-exposure system recited in claim 15.

17. A projection-exposure system, comprising:

a reticle stage configured to hold a reticle on a first surface;

a substrate stage configured to hold a photosensitive substrate on a second surface;

a projection-optical system situated and configured to project an image of the first surface onto the second surface; and an illumination-optical system as recited in claim 8, the illumination-optical system being configured to illuminate the first and the second surfaces simultaneously by illuminating the first surface, and being configured in advance to correct at least one uneven illumination irregularity on the first surface or on the second surface serving as the illumination area.

18. A microdevice-manufacturing method, comprising a lithographic step performed using the projection-exposure system recited in claim 17.

* * * * *

UNITED STATES PATENT AND TRADEMARK OFFICE
CERTIFICATE OF CORRECTION

PATENT NO.        : 7,636,149 B2                               Page 1 of 1
APPLICATION NO.   : 10/556712
DATED             : December 22, 2009
INVENTOR(S)       : Kenji Suzuki It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 919 days.

Signed and Sealed this

Ninth Day of November, 2010

David J. Kappos
*Director of the United States Patent and Trademark Office*